(12) United States Patent
Sato et al.

(10) Patent No.: US 6,242,153 B1
(45) Date of Patent: Jun. 5, 2001

(54) POSITIVE PHOTORESIST COMPOSITION FOR FAR ULTRAVIOLET RAY EXPOSURE

(75) Inventors: Kenichiro Sato; Toshiaki Aoai, both of Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/048,787

(22) Filed: Mar. 27, 1998

(30) Foreign Application Priority Data

| Mar. 27, 1997 | (JP) | 9-075643 |
| Mar. 27, 1997 | (JP) | 9-075644 |
| Apr. 1, 1997 | (JP) | 9-082854 |
| Apr. 1, 1997 | (JP) | 9-082855 |

(51) Int. Cl.$^7$ .................................................. G03F 7/004
(52) U.S. Cl. ...................... 430/270.1; 430/905; 430/906; 430/910
(58) Field of Search ................................. 430/270.1, 905, 430/906, 910

(56) References Cited

U.S. PATENT DOCUMENTS

| 5,587,274 | * | 12/1996 | Kishida et al. | 430/270.1 |
| 5,658,706 | * | 8/1997 | Niki et al. | 430/270.1 |
| 5,738,975 | * | 4/1998 | Nakano et al. | 430/280.1 |
| 5,744,281 | * | 4/1998 | Niki et al. | 430/910 |
| 5,780,566 | * | 7/1998 | Mertesdorf et al. | 430/270.1 |
| 5,786,900 | * | 3/1999 | Watanabe et al. | 430/270.1 |
| 5,824,451 | * | 10/1998 | Aoai et al. | 430/270.1 |
| 5,851,727 | * | 12/1998 | Choi et al. | 430/270.1 |
| 5,994,025 | * | 11/1999 | Iwasa et al. | 430/270.1 |

* cited by examiner

*Primary Examiner*—John S. Chu
(74) *Attorney, Agent, or Firm*—Sughrue, Mion, Zinn, Macpeak & Seas, PLLC

(57) ABSTRACT

A positive photoresist composition for far ultraviolet ray exposure use, which comprises a resin that contains a repeating structural unit composed of a monomer having a specified acid-decomposable group and another monomer having an amine structure in its molecule and is decomposed by the action of an acid thereby increasing its alkali solubility, and a compound that generates an acid by irradiation of an active light ray or radiation, or a positive photoresist composition for far ultraviolet ray exposure use, which comprises a resin that contains a monomer having a specified acid-decomposable group, as a repeating structural unit, and is decomposed by the action of an acid thereby increasing its alkali solubility, a compound that generates an acid by irradiation of an active light ray or radiation and a basic low molecular weight compound. To provide a positive photoresist composition for far ultraviolet ray exposure use which is sufficiently suited for a light particularly having a wave length region of from 170 nm to 220 nm, has high sensitivity to light, can provide excellent resist pattern profiles and is excellent in terms of aging storage stability.

7 Claims, No Drawings

POSITIVE PHOTORESIST COMPOSITION FOR FAR ULTRAVIOLET RAY EXPOSURE

FIELD OF THE INVENTION

This invention relates to a positive photoresist composition for far ultraviolet ray exposure use which is suited for a case in which the exposure treatment is carried out with far ultraviolet rays, especially with a light having an extremely short wave length of from 170 nm to 220 nm, more particularly, it relates to a positive photoresist composition for far ultraviolet ray exposure use which can provide excellent resist patterns with a high sensitivity and is also excellent in aging preservation stability.

BACKGROUND OF THE INVENTION

In recent years, demands for more and more improved density and integration of various electric devices have been called for in the field of the production of semiconductor and the like devices which require microprocessing. Along with such demands, strictness of the performance required for photography techniques has been in the extreme, in order to realize miniaturization of resist patterns. Increment of the resolving power of photoresists and shortening of the wave length of exposure lights are equally responsible for carrying out the miniaturization techniques.

In general, resolution (Res) of the optical system can be expressed by the Rayleigh's equation, namely Res=k·γ/NA (wherein k is a process factor, γ is a wave length of exposure light source and NA is a numerical aperture of lens). It can be understood that shortening of the wave length at the time of exposure is effective in resolving a minute pattern (namely in obtaining high resolution) by reducing the rendering line width. Actually, with the reduction of minimum rendering line width, the exposure wave length has been shifted to the g-line (436 nm) and then to the i-line (365 nm) of high pressure mercury lamp, and production of a device in which KrF eximer laser (248 nm) has also been examined. In addition, application of an eximer laser having more shorter wave length, particularly ArF (193 nm), is regarded as a bright prospect of effecting further minute processing.

With regard to photoresists to be exposed to a short wave length light, improvement of integration capacity has been examined on not the monolayer resists which have been produced in the prior art but a multilayer resist system of two or more layers to which surface lithography was applied. However, the complicated process which has been deterring the multilayer resist from its realization is still problematic.

In addition, in the case of the eximer lasers including KrF eximer laser, it is considered in general that it is necessary to improve cost performance of the laser, because not only the gas life is short but also the exposure apparatus itself is expensive to begin with.

Developed in response to this necessity is the so-called chemical amplification type resist which became the main stream from the use for KrF eximer laser exposure. The chemical amplification type resist has a mechanism in which an acid is generated by exposure from a photo acid generator which is present in a catalytically effective amount in the system, and a protecting group of an alkali-soluble group of a binder or a low molecular weight compound is catalytically eliminated by the thus generated catalytically effective amount of acid, thereby ensuring discrimination of solubility in an alkaline developing solution. Since the chemical amplification type resist catalytically uses an acid generated by an optical reaction, its high sensitivity is expected.

In general, the chemical amplification type resist can be divided roughly into three types, namely a 2 component system, a 2.5 component system and a 3 component system in common names. The 2 component system is a combination of a photo acid generator with a binder resin. Said binder resin is a resin having in its molecule a group which is decomposed by the action of an acid and thereby increase solubility of the resin in an alkaline developing solution (also to be referred to as acid decomposable group hereinafter). The 2.5 component system is a modification of the 2 component system which further contains a low molecular weight compound having an acid decomposable group. The 3 component system contains a photo acid generator, an alkali-soluble resin and the above-described low molecular weight compound.

However, shortened wave length of the exposure light has caused a new problem. That is, in a photoresist, a raw material having excellent transparency for a light of short wave length has a problem in terms of dry etching resistance. On the contrary, a raw material having excellent dry etching resistance has a problem of poor transparency. Compatibility of dry etching resistance with transparency is basically an issue of the performance of binder resin in the photoresist layer.

Examples of the binder include a novolak resin and poly-p-hydroxystyrene. The novolak resins widely used as an alkali-soluble resin for i-line resists, and poly-p-hydroxystyrene is used as a base polymer for KrF eximer laser resists. These binders do not cause serious problems when a light of long wave length is used. However, it is not the same in the case of a short wave length light. Particularly, since the aforementioned resins have a high optical density within the wavelength region of 170 nm to 220 nm, it is virtually impossible to use them directly in the conventional manner. Because of this, great concern has been directed toward the development of a resin which has high light transparency and high dry etching resistance.

As one of the general answers for this issue, there is a method in which an alicyclic hydrocarbon moiety is introduced into a resin. Also, there is a method in which the naphthalene nucleus of an aromatic compound is utilized. Particularly, there are a number of reported methods in which both of the requirements for light transparency and dry etching resistance are gratified by the introduction of an alicyclic hydrocarbon moiety. An example of such methods is described in *Journal of Photopolymer Science and Technology*, vol.3, p.439, 1992.

However, the resist for KrF eximer laser use and the resist for use in the exposure to far ultraviolet rays having a wavelength region of 170 nm to 220 nm are completely different from each other because of the different exposure wavelength regions, and it is the present situation that there is no distinct guiding principle on how to design such a resist composition for far ultraviolet ray exposure use.

On the other hand, it is important to select a group as the acid decomposable group in an acid decomposable group-containing resin, because it exerts influences particularly upon sensitivity and resolution of resists and even upon their aging stability.

As the acid decomposable group which protects carboxylic acid groups, mainly t-butyl ester and the like tertiary alkyl esters and tetrahydropyranyl ester, ethoxyethyl ester and the like acetal esters have so far been reported. However, the t-butyl ester group has a problem in that elimination capacity by the generated acid is poor and the sensitivity therefore is reduced. On the other hand, the tetrahydropyranyl ester, ethoxyethyl ester and the like acetal esters have a serious problem in terms of aging stability, because they are apt to be decomposed even at ordinary temperature.

In addition, JP-A-5-346668 (the term "JP-A" as used herein means an "unexamined published Japanese patent application") proposes that 3-oxocyclohexyl ester group be used as the acid decomposable group, but this is not always satisfactory in terms of sensitivity.

Thus, it is not necessarily clear about how to design a carboxylic acid-protecting acid decomposable group which satisfies both sensitivity and aging preservation stability in a photoresist.

SUMMARY OF THE INVENTION

In view of the above, it therefore becomes an object of the present invention to provide a positive photoresist composition for far ultraviolet ray exposure use which is best suited for a light having a wavelength region of from 170 nm to 220 nm, has a high sensitivity to light, can provide excellent resist pattern profile and is also excellent in aging preservation stability.

Taking the aforementioned various characteristics into consideration, the inventors of the present invention have conducted intensive studies and accomplished the invention based on the finding that the above object can be resolved perfectly by the following constructions.

That is, the aforementioned object can be resolved by the following constructions.

(1) A positive photoresist composition for far ultraviolet ray exposure use, which comprises a resin that contains a repeating structural unit composed of a monomer represented by the following general formula [I] and another monomer having an amine structure in its molecule and is decomposed by the action of an acid thereby increasing its alkali solubility, and a compound that generates an acid by irradiation of an active light ray or radiation:

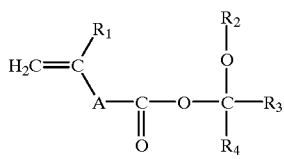

[I]

wherein $R_1$ represents a hydrogen atom or a methyl group, $R_2$ represents an alkyl group, a cyclic alkyl group or a substituted alkyl group, $R_3$ and $R_4$ may be the same or different and each represents a hydrogen atom or an alkyl group, with the proviso that at least one of $R_3$ and $R_4$ is a hydrogen atom, and A represents a single bond or one group or a combination of two or more groups selected from an alkylene group, a substituted alkylene group, an ether group, a thioether group, a carbonyl group, an ester group, an amido group, a sulfonamido group, a urethane group and a urea group.

(2) The positive photoresist composition for far ultraviolet ray exposure use described in the above item (1) wherein the repeating structural unit content of the resin, corresponding to said monomer having an amine structure in its molecule, is within the range of from 0.001 mol % to 10 mol % based on the total repeating unit.

(3) The positive photoresist composition for far ultraviolet ray exposure use described in the above item (1) or (2) wherein said monomer having an amine structure in its molecule is a monomer represented by the following general formula [II]:

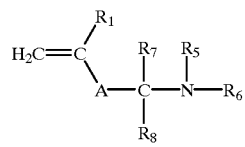

[II]

wherein $R_1$ and A are as defined in the aforementioned item (1), $R_5$ and $R_6$ may be the same or different and each represents an alkyl group or a substituted alkyl group, or $R_5$ and $R_6$ may be linked to each other to form a ring which may contain a hetero atom, and $R_7$ and $R_8$ may be the same or different and each represents a hydrogen atom, an alkyl group or a substituted alkyl group.

(4) The positive photoresist composition for far ultraviolet ray exposure use described in any one of the aforementioned items (1) to (3) wherein said resin further contains a repeating structural unit having an alicyclic hydrocarbon moiety in its molecule.

(5) A positive photoresist composition for far ultraviolet ray exposure use, which comprises a resin that contains a monomer represented by the following general formula [I'] as a repeating structural unit and is decomposed by the action of an acid thereby increasing its alkali solubility, a compound that generates an acid by irradiation of an active light ray or radiation and a basic low molecular weight compound:

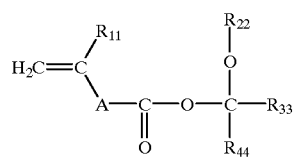

[I']

wherein $R_{11}$ represents a hydrogen atom or a methyl group, $R_{22}$ represents an alkyl group, a cyclic alkyl group or a substituted alkyl group, $R_{33}$ and $R_{44}$ may be the same or different and each represents a hydrogen atom or an alkyl group and A represents a single bond or one group or a combination of two or more groups selected from an alkylene group, a substituted alkylene group, an ether group, a thioether group, a carbonyl group, an ester group, an amido group, a sulfonamido group, a urethane group and a urea group.

(6) The positive photoresist composition for far ultraviolet ray exposure use described in the above item (5) wherein the content of said basic low molecular weight compound is within the range of from 0.001% by weight to 10% by weight based on the total solid.

(7) The positive photoresist composition for far ultraviolet ray exposure use described in the aforementioned item (5) or (6) wherein said resin further contains a repeating structural unit having an alicyclic hydrocarbon moiety in its molecule.

(8) The positive photoresist composition for far ultraviolet ray exposure use described in any one of the aforementioned items (5) to (7) wherein said basic low molecular weight compound is at least one of triphenylimidazole, 4-dimethylaminopyridine and 2-dimethylaminopyridine.

As described in the foregoing, though the acetal ester group (acid decomposable group) has high hydrolyzing ability and excellent sensitivity, it cannot be used because of its aptness to undergo decomposition during its storage at ordinary temperature. However, according to the present invention, it was able, surprisingly, to improve aging preservation stability of a positive photoresist composition for far ultraviolet ray exposure use while maintaining its high sensitivity, by employing a copolymer which contains a repeating structural unit composed of a monomer represented by the general formula [I] and another monomer having an amine structure in its molecule, or by the use of a basic low molecular weight compound together with a photo acid generator and a resin having a monomer represented by the general formula [I'] (a specified acetal ester group was used as the acid decomposable group).

DETAILED DESCRIPTION OF THE INVENTION

The following describes the present invention in detail.

The alkyl group represented by $R_2$ in the general formula [I] is preferably a straight or branched alkyl group having 1 to 10 carbon atoms, more preferably a straight or branched alkyl group having 1 to 6 carbon atoms, most preferably methyl group, ethyl group, propyl group, isopropyl group, n-butyl group, isobutyl group, sec-butyl group or t-butyl group.

The alkyl group represented by $R_3$ and $R_4$ is preferably methyl, ethyl, propyl, isopropyl, butyl, isobutyl, sec-butyl or the like lower alkyl group, more preferably methyl, ethyl, propyl, isopropyl or butyl group, most preferably methyl or ethyl group.

Examples of the cyclic alkyl group of $R_2$ include cyclopropyl, cyclopentyl, and cyclohexyl groups.

Examples of the substituted alkyl group of $R_2$ include the aforementioned alkyl groups further having a substituent group such as hydroxyl group, a halogen atom, an alkoxy group, an acyl group (e.g., formyl, acetyl), cyano group or an acyloxy group (e.g., acetoxy). Examples of the alkoxy group include methoxy, ethoxy, propoxy, and butoxy groups having 1 to 4 carbon atoms.

Examples of the ring which is formed together with oxygen atom by the bonding of two of $R_2$ and $R_3$ or $R_4$ include tetrahydrofuranyl and tetrahydropyranyl groups.

Examples of the alkylene and substituted alkylene groups of the linking group A include those which are represented by the following general formula.

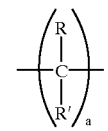

In the above formula, R and R' may be the same or different and each represents a hydrogen atom, an alkyl group, a substituted alkyl group, a halogen atom, a hydroxyl group or an alkoxy group. The alkyl group is preferably methyl, ethyl, propyl, isopropyl, butyl or the like lower alkyl group, more preferably methyl group, ethyl group, propyl group or isopropyl group. Examples of substituent group of the substituted alkyl group include a hydroxyl group, a halogen atom and an alkoxy group. Examples of the alkoxy group include methoxy, ethoxy, propoxy, and butoxy groups having 1 to 4 carbon atoms. The symbol "a" means an integer. of 1 to 10.

Among the aforementioned examples of the group A, particularly preferred is a single bond or one group or a combination of two or more groups selected from an alkylene group, a substituted alkylene group, an ether group, an ester group, an amido group, a urethane group and a urea group. An alkylene group having 1 to 4 carbon atoms is desirable as the alkylene or substituted alkylene group, and its illustrative examples include methylene group, ethylene group, propylene group, butylene group, methyl substituted methylene group, dimethyl substituted methylene group, methyl substituted ethylene group, dimethyl substituted ethylene group, methyl substituted propylene group and dimethyl substituted propylene group.

Monomers represented by the following general formulae [I-A] to [I-K] can be cited as preferred examples of the monomer of general formula [I].

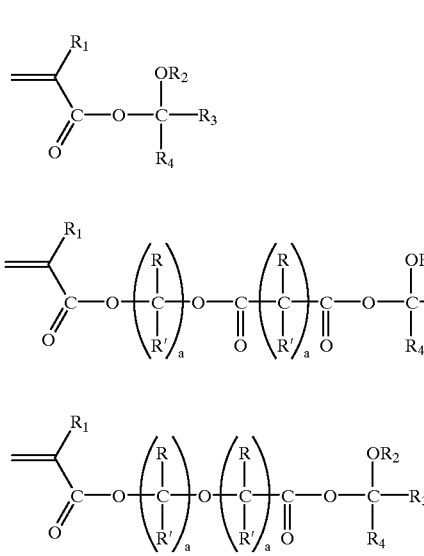
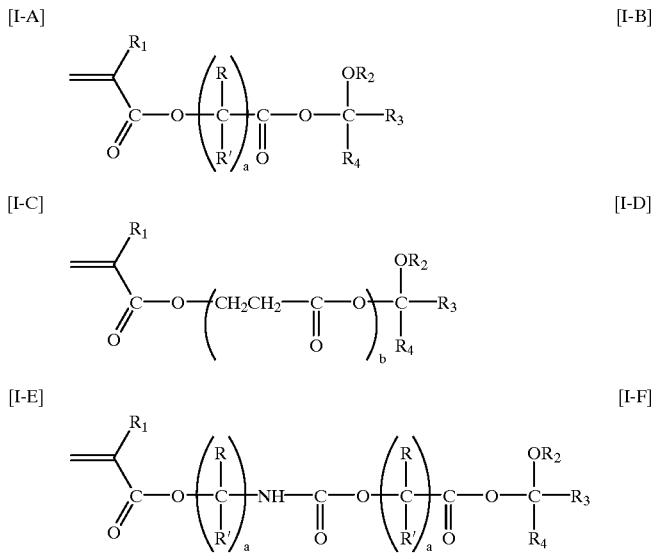

-continued
[I-G] 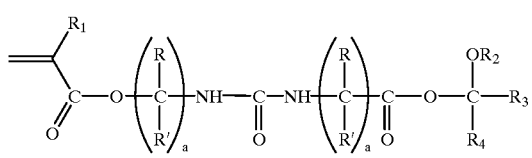
[I-H] 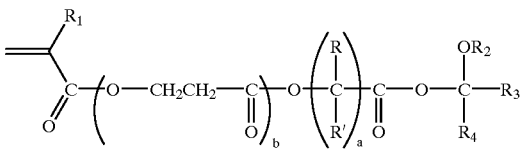
[I-I] 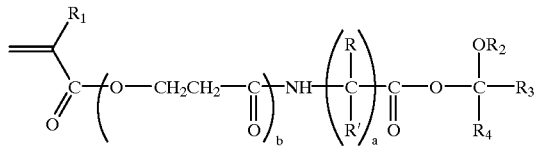
[I-J] 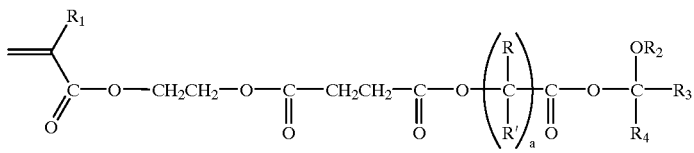
[I-K] 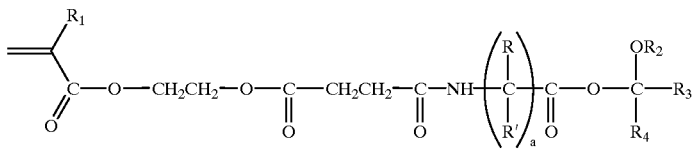
In the above general formulae, $R_1$ to $R_4$, R, R' and "a" are as defined in the foregoing, and "b" is an integer of 1 to 3.
Illustrative examples of the monomer of general formula [I] are shown below, but they do not limit the scope of the invention.
[I-A-1] 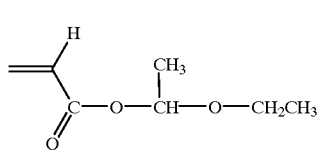
[I-A-2] 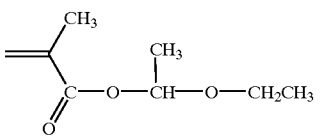
[I-A-3] 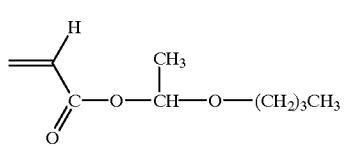
[I-A-4] 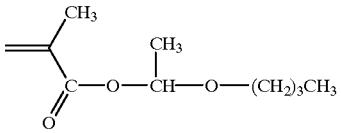
[I-A-5] 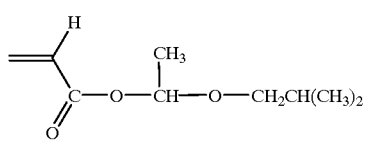
[I-A-6] 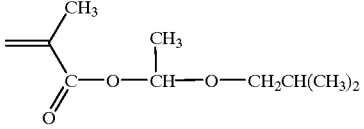
[I-A-7] 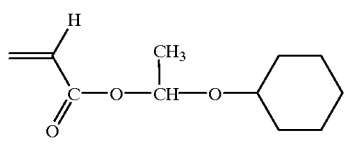
[I-A-8] 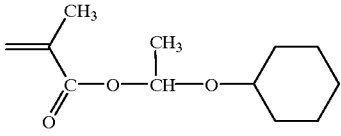

-continued
[I-A-9]
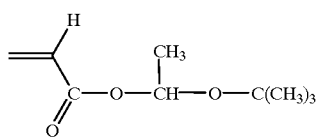
[I-A-10]
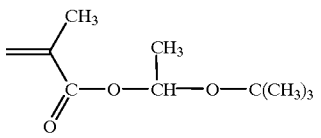
[I-A-11]
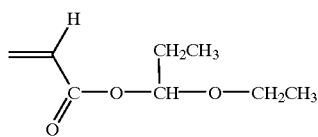
[I-A-12]
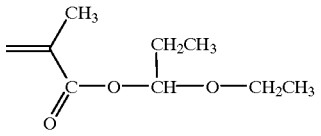
[I-A-13]
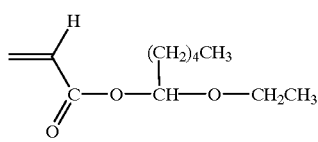
[I-A-14]
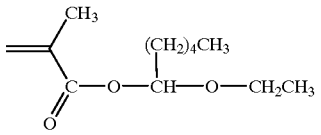
[I-A-15]
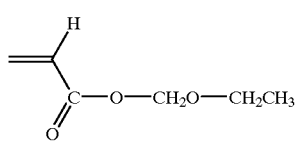
[I-A-16]
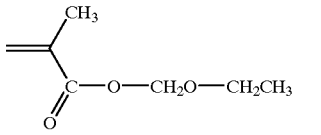
[I-A-17]
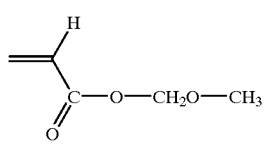
[I-A-18]
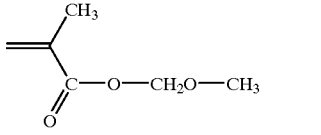
[I-B-1]
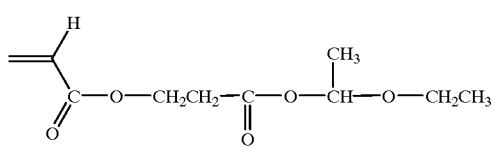
[I-B-2]
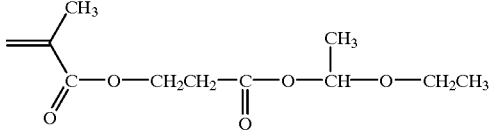
[I-B-3]
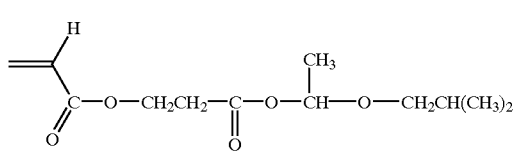
[I-B-4]
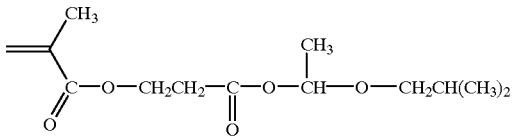
[I-B-5]
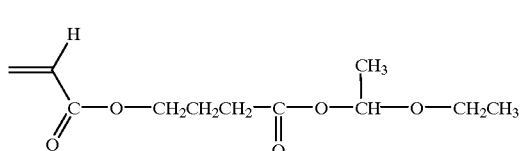
[I-B-6]
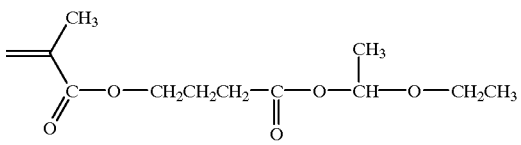
[I-B-7]
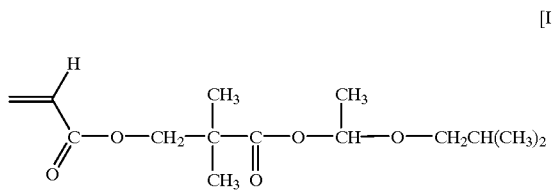
[I-B-8]
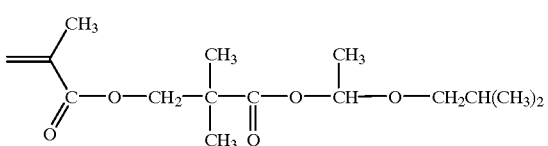
[I-C-1]
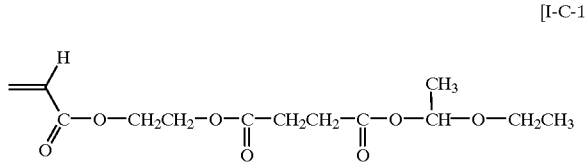
[I-C-2]
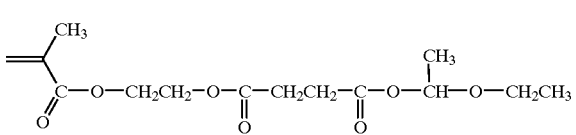

-continued
[I-C-3] 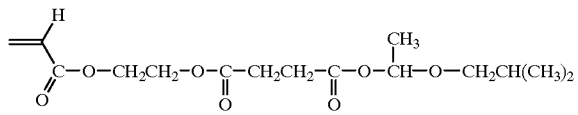 [I-C-4] 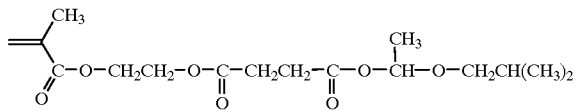
[I-D-1] 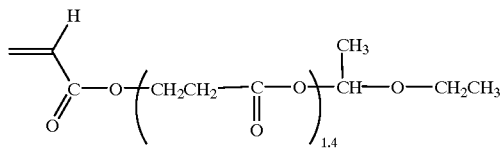 [I-D-2] 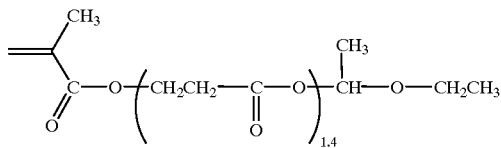
[I-D-3] 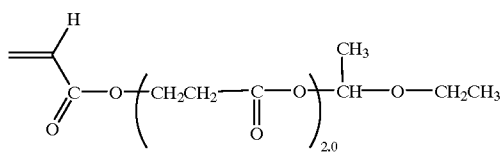 [I-D-4] 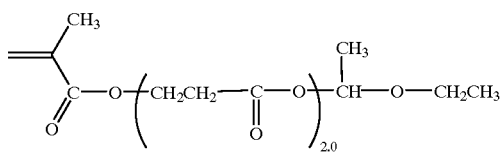
[I-D-5] 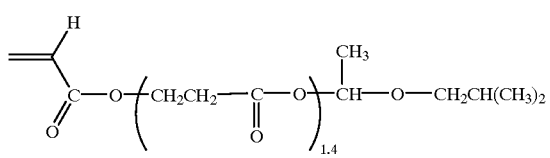 [I-D-6] 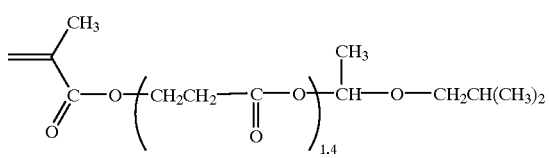
[I-E-1] 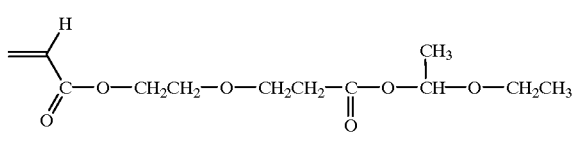 [I-E-2] 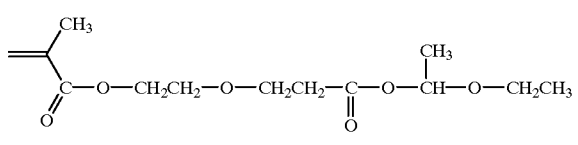
[I-E-3] 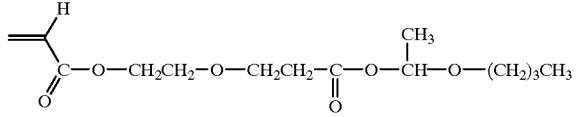 [I-E-4] 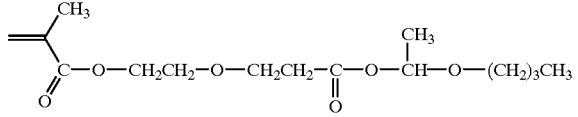
[I-E-5] 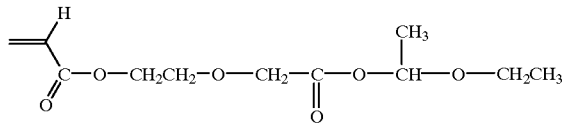 [I-E-6] 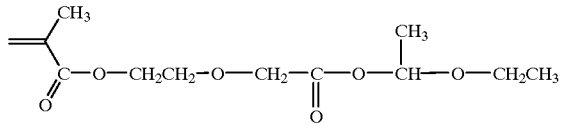
[I-E-7] 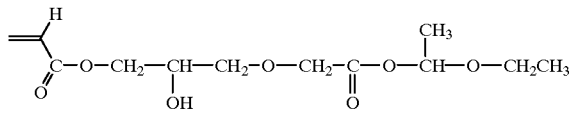 [I-E-8] 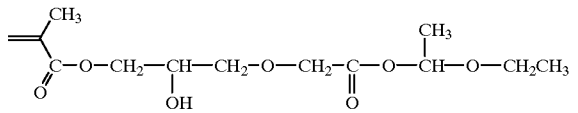
[I-E-9] 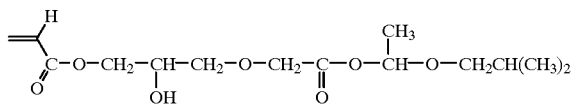 [I-E-10] 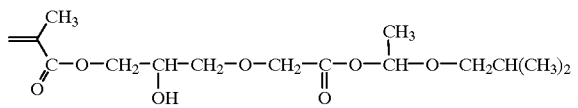
[I-F-1] 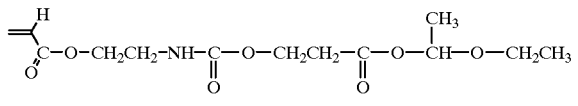 [I-F-2] 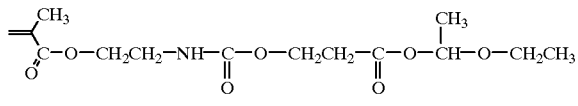

-continued
[I-F-3]
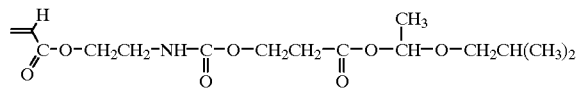
[I-F-4]
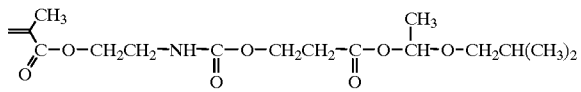
[I-F-5]
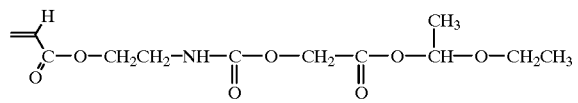
[I-F-6]
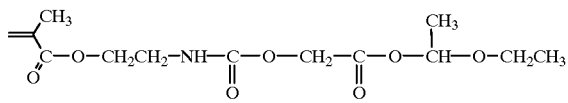
[I-F-7]
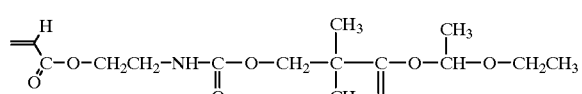
[I-F-8]
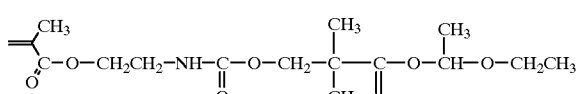
[I-F-9]
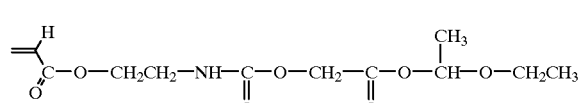
[I-F-10]
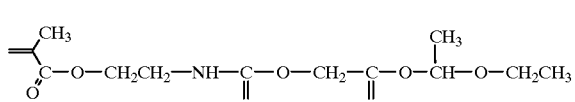
[I-G-1]
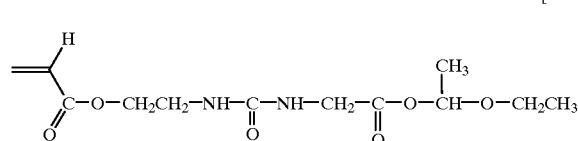
[I-G-2]
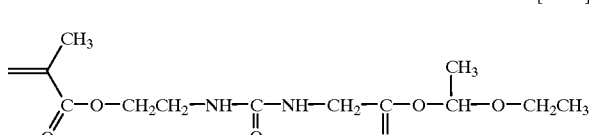
[I-G-3]
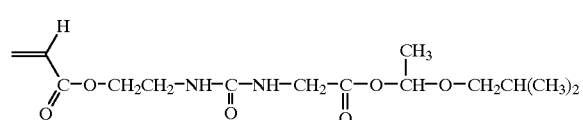
[I-G-4]
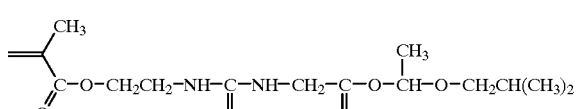
[I-G-5]
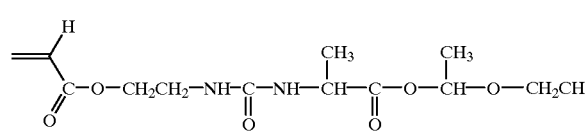
[I-G-6]
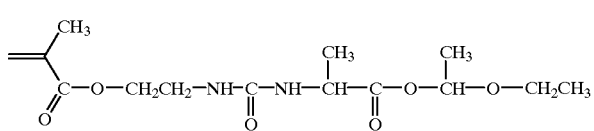
[I-G-7]
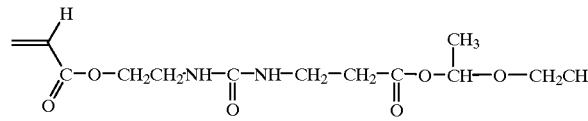
[I-G-8]
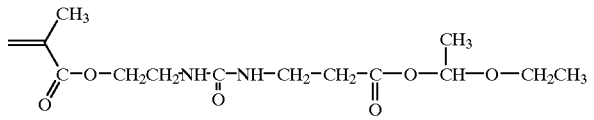
[I-G-9]
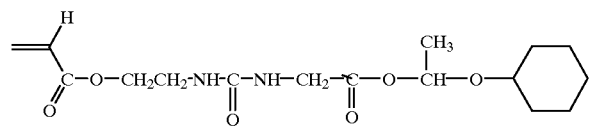
[I-G-10]
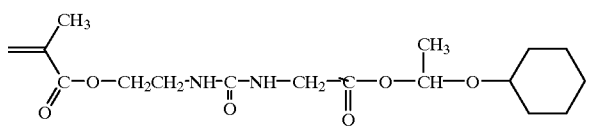
[I-H-1]
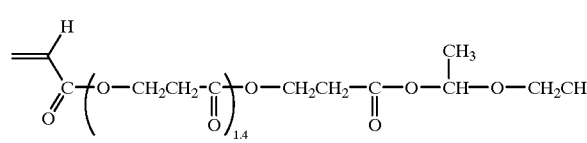
[I-H-2]
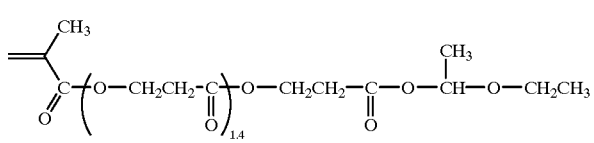

-continued
[I-H-3] 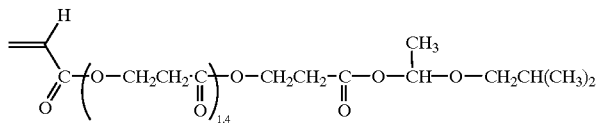 [I-H-4] 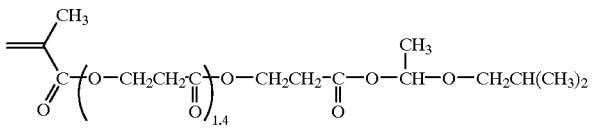
[I-I-1] 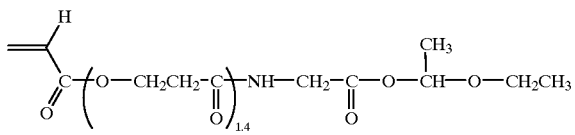 [I-I-2] 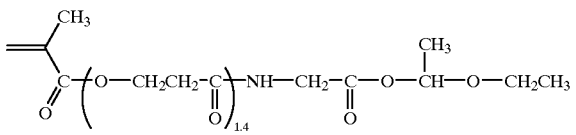
[I-I-3] 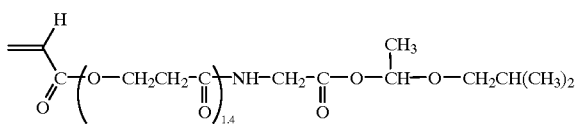 [I-I-4] 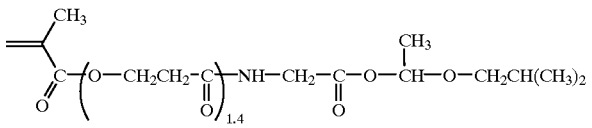
[I-I-5] 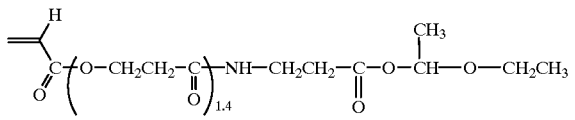 [I-I-6] 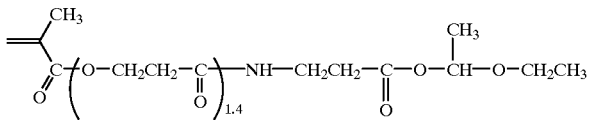
[I-J-1] 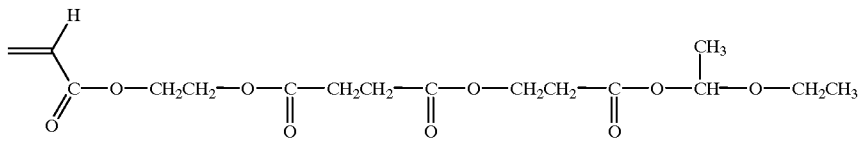
[I-J-2] 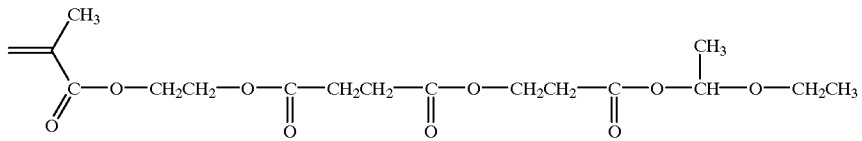
[I-J-3] 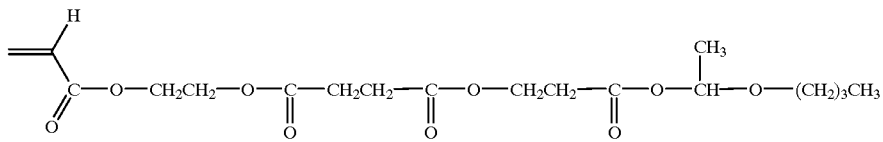
[I-J-4] 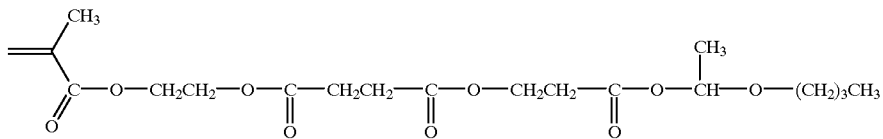
[I-K-1] 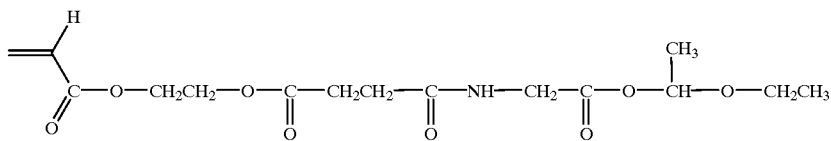

[I-K-2]

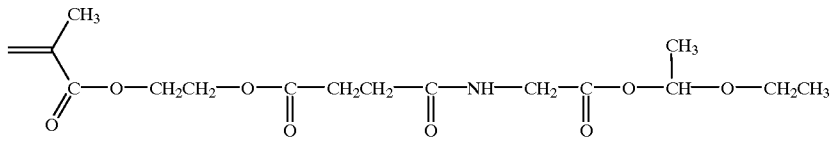

[I-K-3]

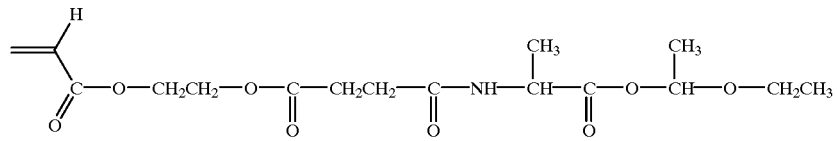

[I-K-4]

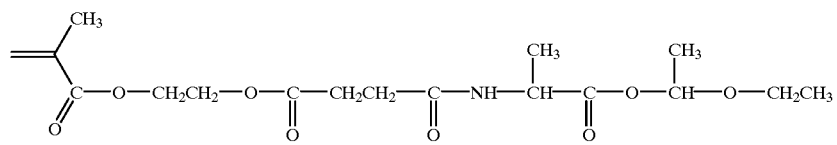

According to the present invention, examples of the monomer having an amine structure include those monomers which have amino group or an alkyl substituted amino group and are polymerizable with the monomer of the aforementioned general formula [I].

According to the present invention, examples of the monomer having an amine structure include monomers represented by the aforementioned general formula [II].

Examples of the alkyl group and substituted alkyl group of $R_5$ to $R_8$ in the general formula [II] include those which have been described in relation to $R_2$ of the aforementioned general formula [I].

With regard to the ring which is formed together with nitrogen atom through the bonding of $R_5$ and $R_6$ in the monomer represented by the aforementioned general formula [II], nitrogen atom, oxygen atom or sulfur atom can be exemplified as the hetero atom. Illustrative examples of the ring include pyrrolidine, piperidine, piperazine, N-alkylpiperazine, morpholine, thiomorpholine and the like rings.

Monomers represented by the following general formulae [II-A] to [II-J] can be cited as preferred examples of the monomer of general formula [II].

[II-A]

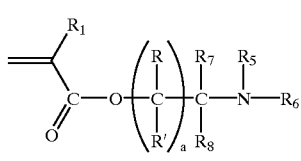

[II-B]

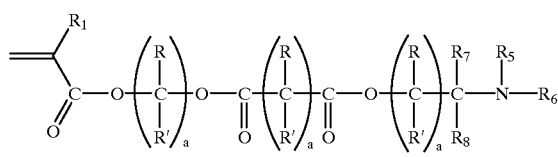

[II-C]

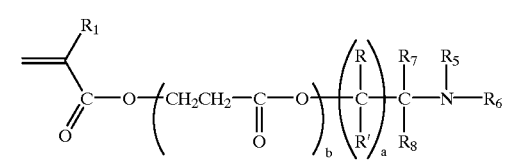

[II-D]

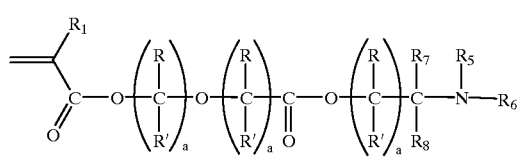

[II-E]

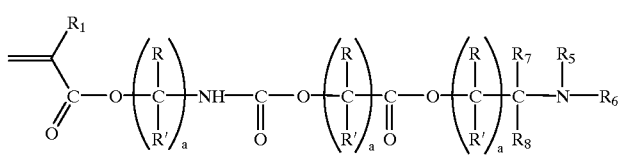

-continued
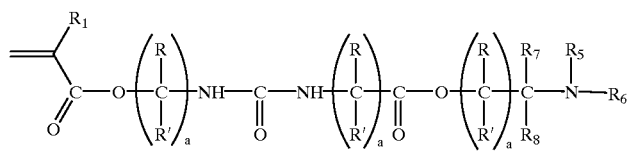
[II-F]
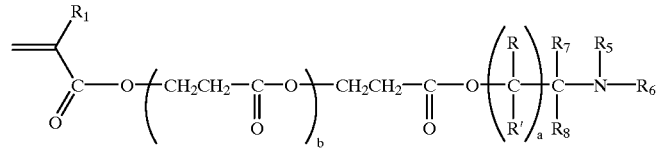
[II-G]
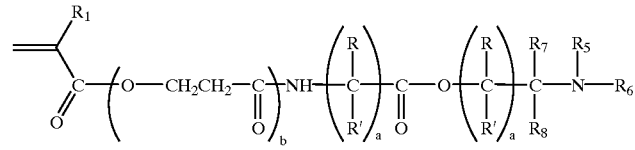
[II-H]
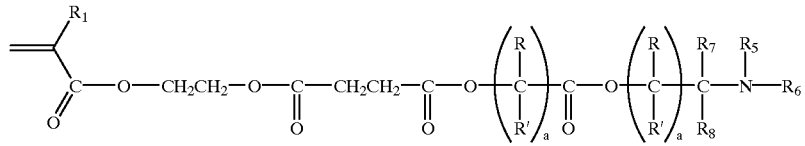
[II-I]
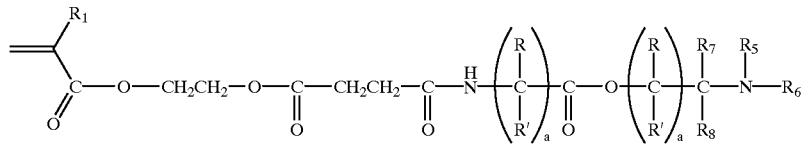
[II-J]
In the above general formulae, $R_1$, $R_5$ to $R_8$, $R$, $R'$ and "a" are, as defined in the foregoing, and "b" is an integer of 1 to 3.
Illustrative examples of the monomer of general formula [II] are shown below, but they do not limit the scope of the invention.
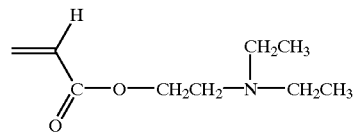
[II-A-1]
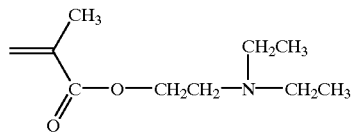
[II-A-2]
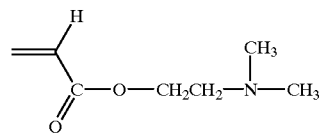
[II-A-3]
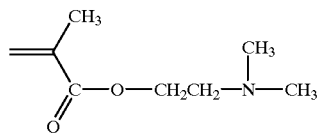
[II-A-4]
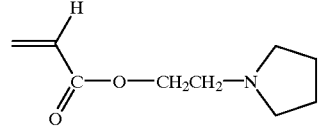
[II-A-5]
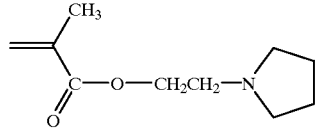
[II-A-6]

-continued
[II-A-7]
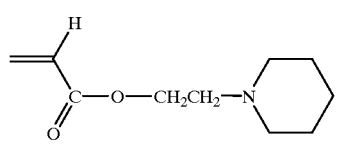
[II-A-8]
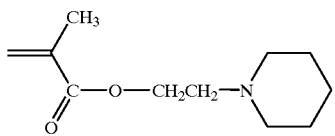
[II-A-9]
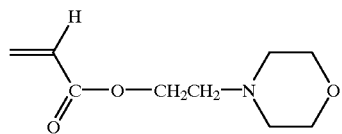
[II-A-10]
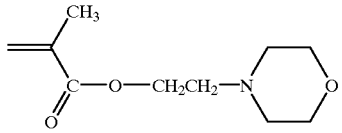
[II-A-11]
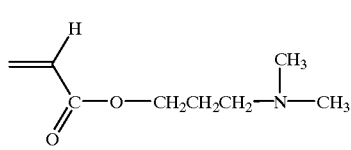
[II-A-12]
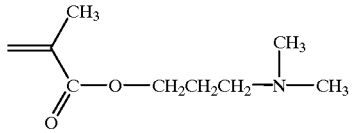
[II-A-13]
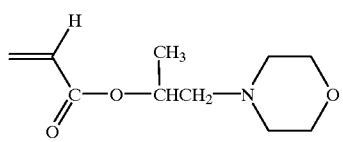
[II-A-14]
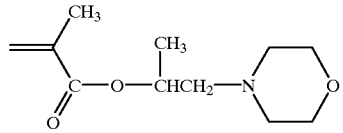
[II-B-1]
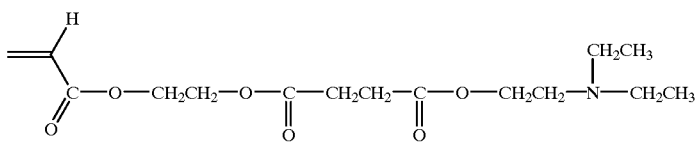
[II-B-2]
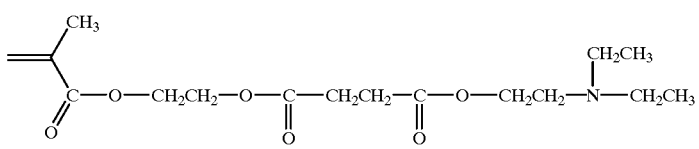
[II-B-3]
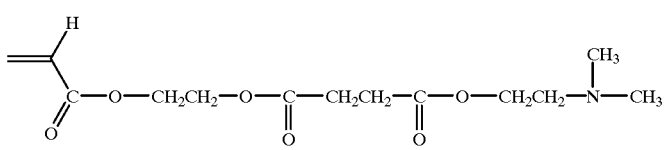
[II-B-4]
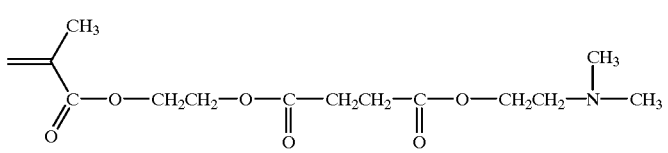
[II-B-5]
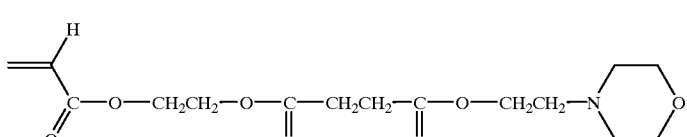
[II-B-6]
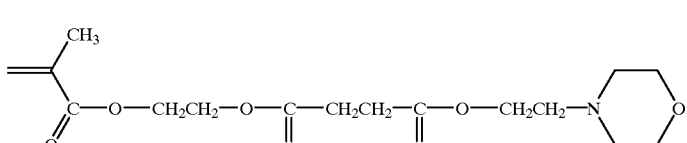

[II-B-7]
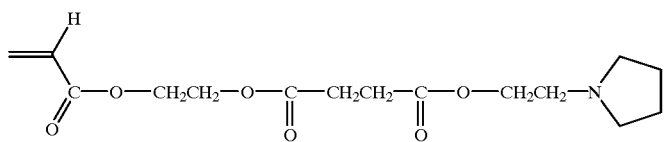
[II-B-8]
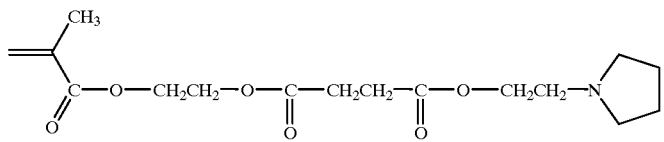
[II-C-1]
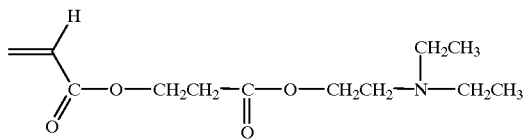
[II-C-2]
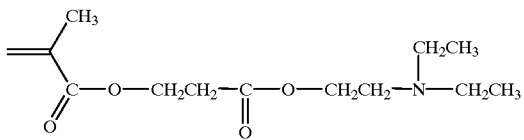
[II-C-3]
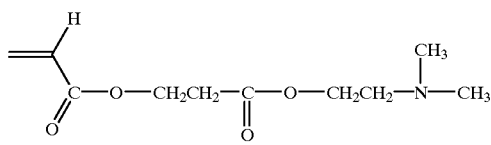
[II-C-4]
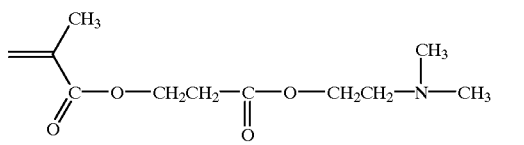
[II-C-5]
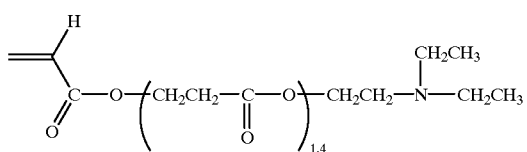
[II-C-6]
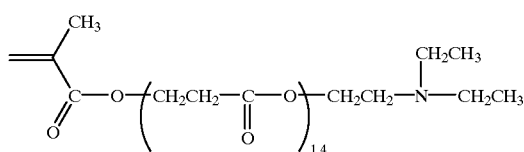
[II-D-1]
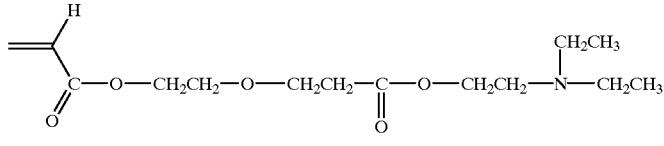
[II-D-2]
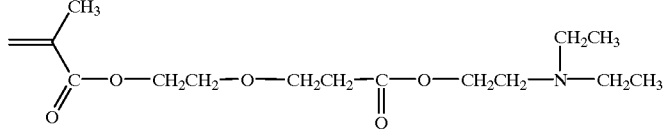
[II-D-3]
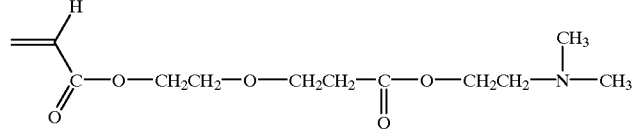
[II-D-4]
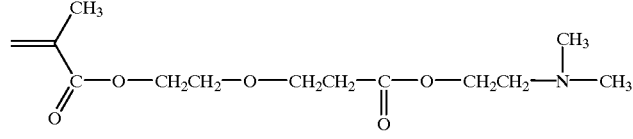
[II-D-5]
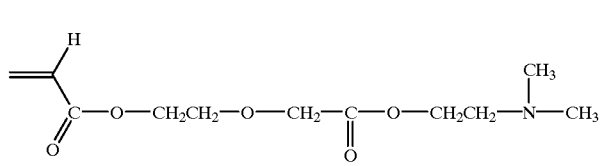

[II-D-6]
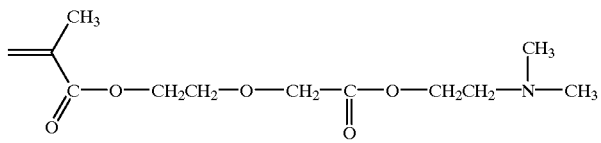
[II-D-7]
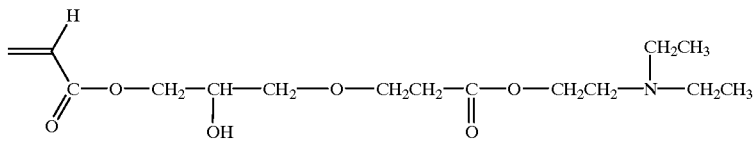
[II-D-8]
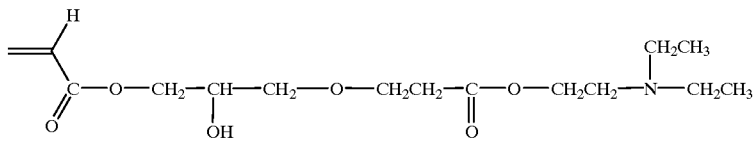
[II-E-1]
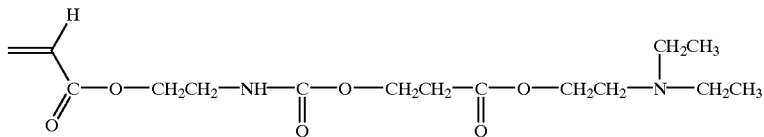
[II-E-2]
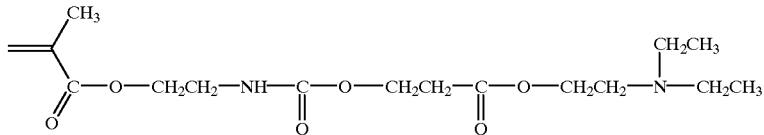
[II-E-3]
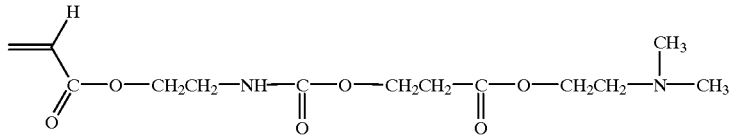
[II-E-4]
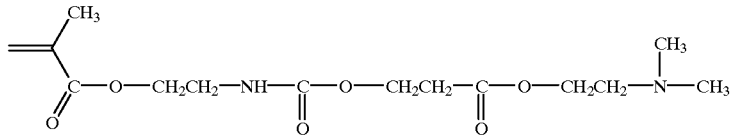
[II-E-5]
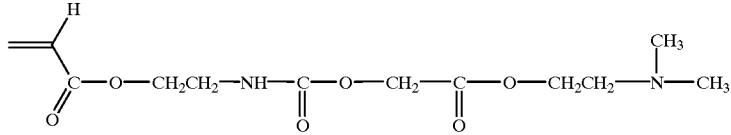
[II-E-6]
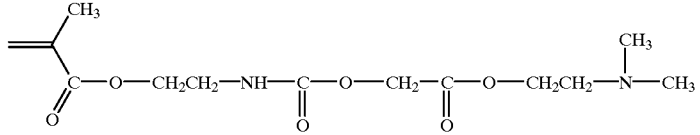
[II-F-1]
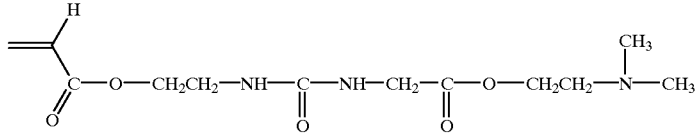

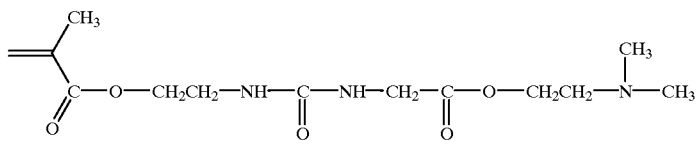
[II-F-2]
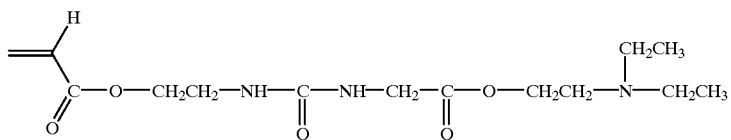
[II-F-3]
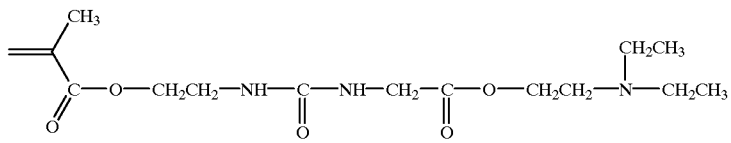
[II-F-4]
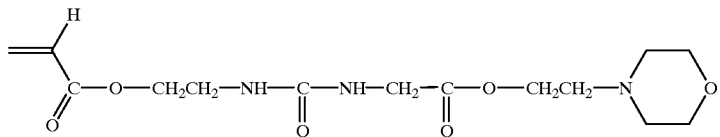
[II-F-5]
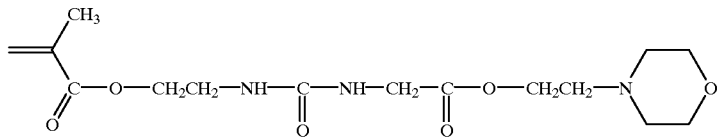
[II-F-6]
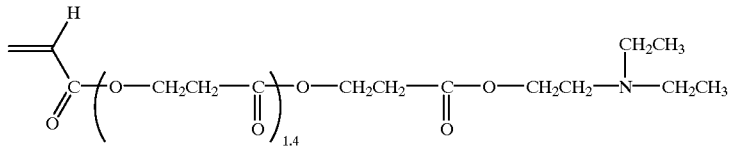
[II-G-1]
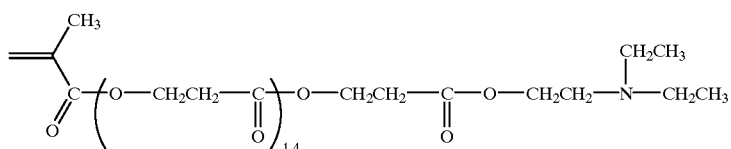
[II-G-2]
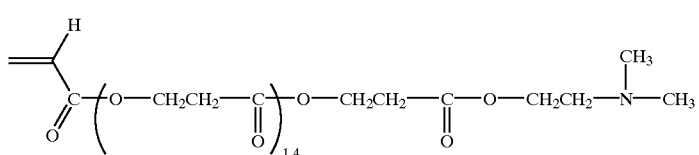
[II-G-3]
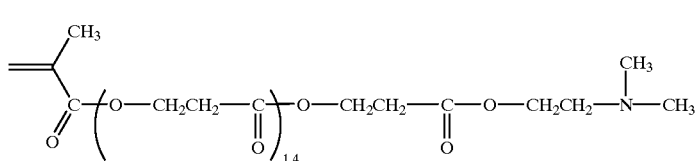
[II-G-4]

[II-H-1]
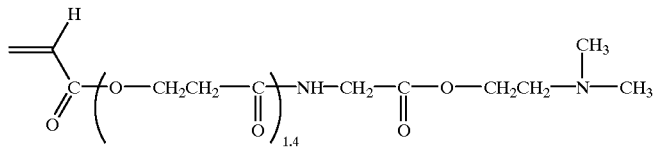
[II-H-2]
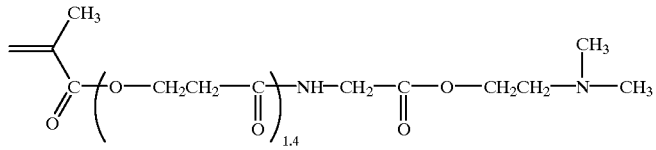
[II-H-3]
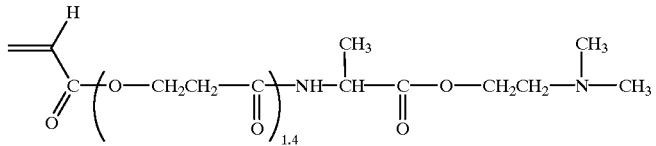
[II-H-4]
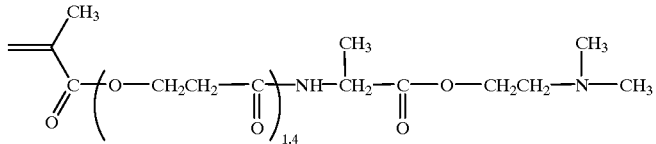
[II-H-5]
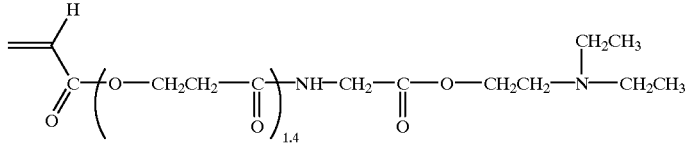
[II-H-6]
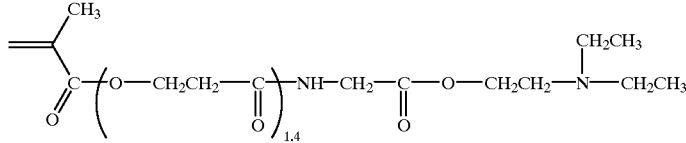
[II-I-1]
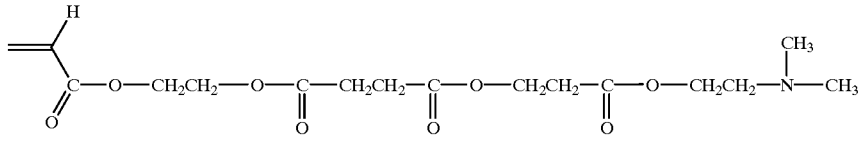
[II-I-2]
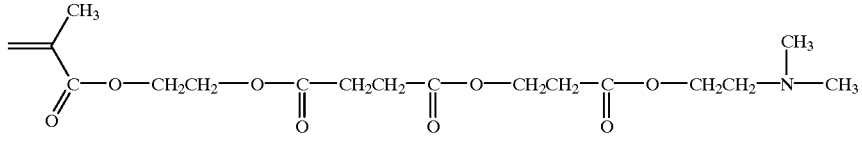
[II-I-3]
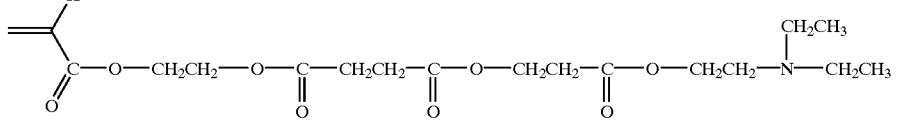

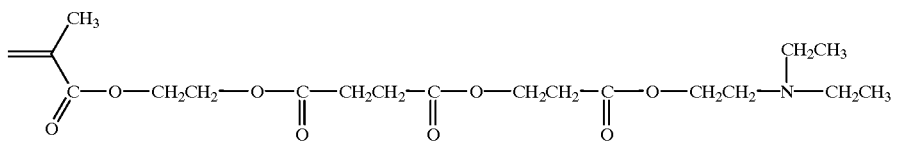

[II-I-4]

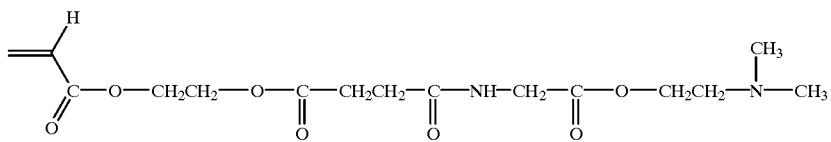

[II-J-1]

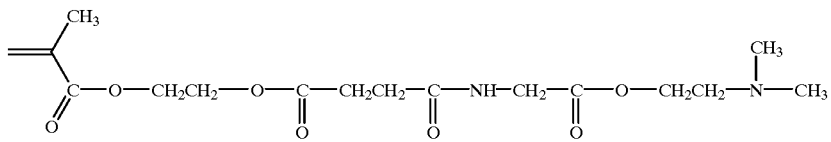

[II-J-2]

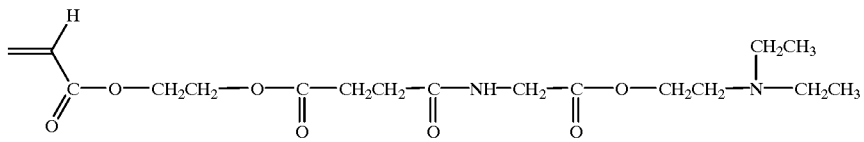

[II-J-3]

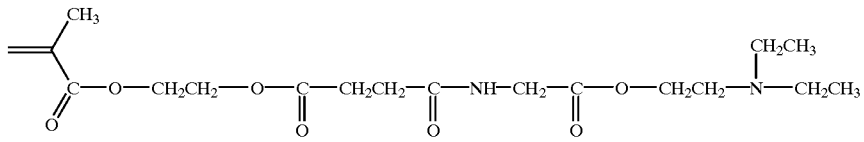

[II-J-4]

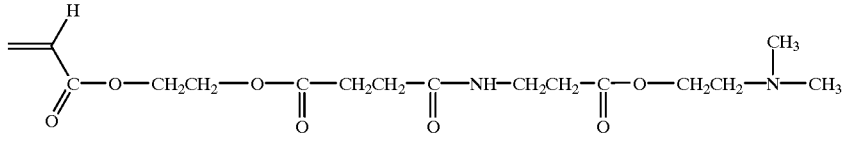

[II-J-5]

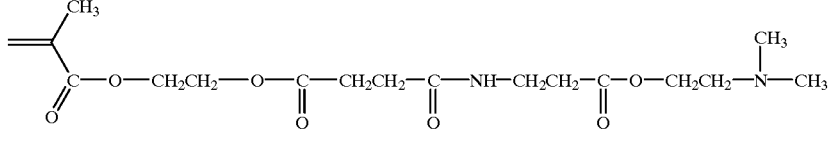

[II-J-6]

The monomer of general formula [I] can be obtained generally by allowing a corresponding carboxylic acid monomer to react with an alkylvinyl ether in the presence of an acid catalyst or by allowing a corresponding carboxylic acid monomer to react with an alkoxymethyl halogenide under a basic condition. Examples of the former acid catalyst include 2-ethylhexyl phosphate and paratoluenesulfonic acid and the like sulfonic acids, described for example in *Shikizai (Coloring Materials)*, 69 (11), 735 (1996).

The monomer of general formula [II] can be obtained generally by ester interchange reaction of a lower alkyl (methyl for example) ester of a corresponding carboxylic acid with a hydroxyalkyl substituted amine, or by esterification reaction of a corresponding acid halide with a hydroxyalkyl substituted amine.

Next, the resin having a monomer represented by the aforementioned general formula [I'] is described.

The alkyl group of $R_{22}$ in the general formula [I'] is preferably a straight or branched alkyl group having 1 to 10 carbon atoms, more preferably a straight or branched alkyl group having 1 to 6 carbon atoms, most preferably methyl group, ethyl group, propyl group, isopropyl group, n-butyl group, isobutyl group, sec-butyl group or t-butyl group. The alkyl group represented by $R_{33}$ and $R_{44}$ is preferably methyl, ethyl, propyl, isopropyl, butyl, isobutyl, sec-butyl or the like lower alkyl group, more preferably methyl, ethyl, propyl, isopropyl or butyl group, most preferably methyl or ethyl group.

Examples of the cyclic alkyl group of $R_{22}$ include cyclopropyl, cyclopentyl, and cyclohexyl groups.

Examples of the substituted alkyl group of $R_{22}$ include the aforementioned alkyl groups further having a substituent group such as hydroxyl group, a halogen atom, an alkoxy group, an acyl group, cyano group or an acyloxy group. Examples of the alkoxy group include methoxy, ethoxy, propoxy, and butoxy groups having 1 to 4 carbon atoms, examples of the acyl group include formyl and acetyl groups and examples of the acyloxy group include an acetoxy group.

Examples of the alkylene group and substituted alkylene group of the linking group A include those which have been described in relation to the aforementioned general formula [I].

In addition, the aforementioned monomers of general formulae [I-A] to [I-K] can be cited as preferred examples of the monomer represented by the general formula [I'].

As illustrative examples of the monomer represented by the general formula [I'], the same monomers described as illustrative examples of the monomer of general formula [I] can be used.

The above-described monomers represented by the general formula [I'] can be obtained generally by allowing a corresponding carboxylic acid monomer to react with alkylvinyl ethers in the presence of an acid catalyst or by allowing a corresponding carboxylic acid monomer to react with an alkoxymethyl halogenide under a basic condition. Examples of the former acid catalyst include 2-ethylhexyl phosphate and paratoluenesulfonic acid and the like sulfonic acids, described for example in *Shikizai* (*Coloring Materials*), 69 (11), 735 (1996).

The resin to be used in the positive photoresist composition of the present invention may desirably contain a repeating structural unit having an alicyclic hydrocarbon moiety in its molecule, together with the monomer of the aforementioned general formula [I] and the monomer having an amine structure in its molecule or the monomer represented by the aforementioned general formula [I']. By this inclusion, dry etching resistance of the positive photoresist can be improved. As such a repeating structural unit having an alicyclic hydrocarbon moiety in its molecule, the repeating structural unit represented by the following general formula [III] or [IV] can be exemplified.

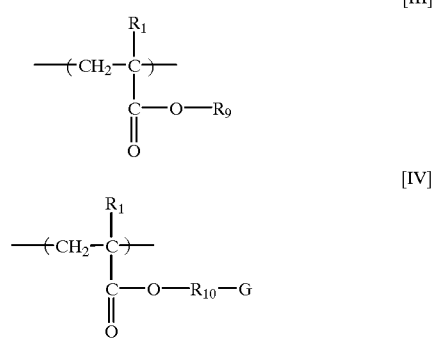

In the general formula [III], $R_9$ is a monovalent alicyclic hydrocarbon radical. Its illustrative examples include adamantyl, 2-methyl-2-adamantyl, norbornyl, boronyl, isoboronyl, tricyclodecanyl, dicyclopentenyl, norbornane epoxy, menthyl, isomenthyl, and neomentyl groups.

In the general formula [IV], $R_{10}$ is a linking group having a divalent alicyclic hydrocarbon moiety. G represents —COOH, —OH, —COOR$_{11}$ or —OR$_{11}$. $R_{11}$ represents a tertiary alkyl group, tetrahydropyranyl group, tetrahydrofuranyl group, —CH$_2$OR$_{12}$ or —CH(CH$_3$)OR$_{12}$. $R_{12}$ represents an alkyl group.

$R_1$ is as defined in the foregoing.

The following structures can be exemplified as the alicyclic hydrocarbon moiety contained in the linking group of $R_{10}$.

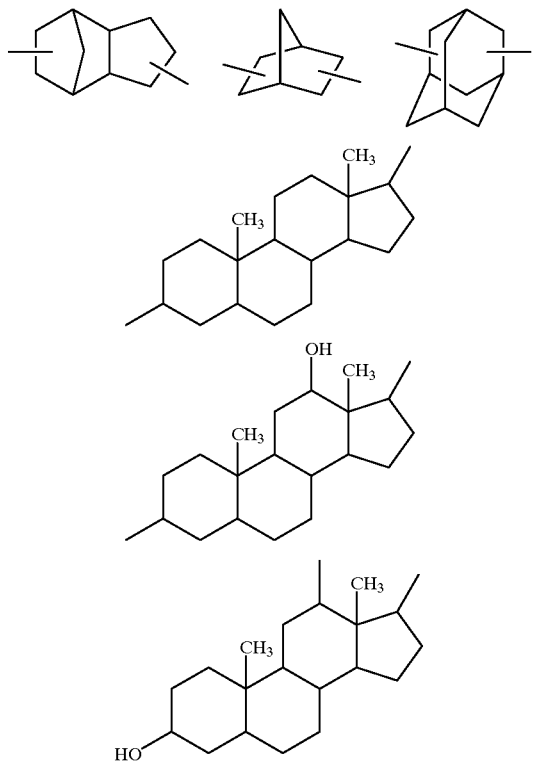

With regard to the linking group in $R_{10}$ which links the aforementioned alicyclic hydrocarbon moiety and an ester group together or the aforementioned alicyclic hydrocarbon moiety and the group G together, it may be a single bond or one group or a combination of two or more groups selected from alkylene, ether, thioether, carbonyl, ester, amido, and sulfonamido groups.

$R_{11}$ in the —COOR$_{11}$ group or —OR$_{11}$ group represents a substituent group which decomposes by the action of an acid, such as tertiary alkyl group (e.g., t-butyl, t-amyl), tetrahydropyranyl group, tetrahydrofuranyl group, 1-alkoxyethyl group (e.g., —CH(CH$_3$)OCH$_2$CH$_3$, —CH(CH$_3$)OCH$_2$CH(CH$_3$)$_2$) or alkoxymethyl group (e.g., —CH$_2$OCH$_3$, —CH$_2$OCH$_2$CH$_3$).

The content of the monomer represented by the general formula [I] in the resin of the present invention is within the range of preferably from 3 to 60 mol %, more preferably from 5 to 50 mol %, based on the total repeating unit. The content if less than 3 mol % would result in reduced sensitivity and if exceeding 60 mol % would cause uncontrollable reduction of etching resistance and sensitivity fluctuation and film thickness loss with lapse of time, so that both cases would be inadequate.

The content of the monomer represented by the general formula [II] in the resin of the present invention is within the range of preferably from 0.001 to 10 mol %, more preferably from 0.01 to 10 mol %, most preferably from 0.1 to 8 mol %, based on the total repeating unit. The content if less than 0.001 mol % would cause uncontrollable sensitivity fluctuation and film thickness loss with lapse of time and if exceeding 10 mol % would cause bad effects such as reduction of sensitivity, so that both cases would be inadequate.

Also, the content of the monomer represented by the general formula [I'] in the resin of the present invention is within the range of preferably from 3 to 60 mol %, more preferably from 5 to 50 mol %, based on the total repeating unit. The content if exceeding 60 mol % would cause uncontrollable reduction of etching resistance and sensitivity fluctuation and film thickness loss with lapse of time.

The content of the repeating structural unit having an alicyclic hydrocarbon moiety in its molecule in the resin of the present invention is within the range of from 40 to 97 mol %, preferably from 45 to 95 mol %, based on the total repeating unit. The content if less than 40 mol % would result in reduced dry etching resistance and if exceeding 97 mol % would cause uncontrollable reduction of sensitivity and sensitivity fluctuation and film thickness loss with lapse of time, so that both cases would be inadequate.

Though not particularly limited, the resin can further be copolymerized with another monomer described in the following as a repeating unit within such a range that the effects of the present invention can be obtained efficiently.

This renders possible fine control of properties required for the aforementioned resin, particularly (1) solubility in coating solvent, (2) film forming property (glass transition point), (3) alkali developing ability, (4) film thickness loss (selection of hydrophilic or hydrophobic alkali soluble groups), (5) adhesiveness to unexposed substrate and (6) dry etching resistance.

Examples of such a copolymer monomer include compounds having one addition polymerizable unsaturated bond, selected from acrylic esters, methacrylic esters, acrylamides, methacrylamides, allyl compounds, vinyl ethers, vinyl esters and the like.

Its illustrative examples include acrylic esters such as alkyl (alkyl group having 1 to 10 carbon atoms is desirable) acrylates (for instance, methyl acrylate, ethyl acrylate, propyl acrylate, amyl acrylate, cyclohexyl acrylate, ethylhexyl acrylate, octyl acrylate, t-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, benzyl acrylate, methoxybenzyl acrylate, furfuryl acrylate, tetrahydrofurfuryl acrylate and the like);

methacrylic esters such as alkyl (alkyl group having 1 to 10 carbon atoms is desirable) methacrylates (for instance, methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, furfuryl methacrylate, tetrahydrofurfuryl methacrylate and the like);

acrylamides such as acrylamide, N-alkylacrylamide (examples of the alkyl group include those having 1 to 10 carbon atoms such as methyl, ethyl, propyl, butyl, t-butyl, heptyl, octyl, cyclohexyl, and hydroxyethyl), N,N-dialkylacrylamide (examples of the alkyl group include those having 1 to 10 carbon atoms such as methyl, ethyl, propyl, isobutyl, ethylhexyl, and cyclohexyl), N-hydroxyethyl-N-methylacrylamide, N-2-acetamidoethyl-N-acetylacrylamide and the like;

methacrylamides such as methacrylamide, N-alkylmethacrylamide (examples of the alkyl group include those having 1 to 10 carbon atoms such as methyl, ethyl, t-butyl, ethylhexyl, hydroxyethyl, and cyclohexyl), N,N-dialkylmethacrylamide (examples of the alkyl group include those having 1 to 10 carbon atoms such as ethyl, propyl, and butyl), N-hydroxyethyl-N-methylmethacrylamide and the like;

allyl compounds such as allyl esters (for example, allyl acetate, allyl caproate, allyl caprylate, allyl laurate, allyl palpitate, allyl stearate, allyl benzoate, allyl acetacetate, allyl lactate and the like), allyloxyethanol and the like;

vinyl ethers such as alkyl vinyl ethers (for example, hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, benzyl vinyl ether, tetrahydrofurfuryl vinyl ether and the like);

vinyl esters such as vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl acetoacetate, vinyl lactate, vinyl-β-phenyl butyrate, vinyl cyclohexylcarboxylate and the like;

dialkyl itaconates (for example, dimethyl itaconate, diethyl itaconate, dibutyl itaconate and the like); dialkyl esters of maleic acid or fumaric acid (for example, dimethyl maleate, dibutyl fumarate and the like) or monoalkyl esters thereof; and acrylic acid, methacrylic acid, crotonic acid, itaconic acid, maleic anhydride, maleimide, acrylonitrile, methacrylonitrile, maleylonitrile and the like.

Other addition polymerizable unsaturated compounds than the above can also be used, provided that they are copolymerizable with the repeating structural unit composed of the monomer represented by the general formula [I] and the monomer having an amine structure in its molecule.

The content of the repeating unit based on such an additional monomer in the resin is preferably 99 mol % or less, more preferably 90 mol % or less, most preferably 80 mol % or less, based on the total mol number of the repeating structural unit composed of the monomer represented by the general formula [I] and the monomer having an amine structure in its molecule or the monomer represented by the general formula [I'] and the repeating structural unit having an alicyclic hydrocarbon moiety. The content if exceeding 99 mol % would bear no sufficient effects of the present invention.

The aforementioned resin can be shown for example by at he following general formula [V] or [VI]. However, contents of the present invention are not restricted thereby.

$$[V]$$

$$-(\text{CH}_2-\underset{\underset{\underset{\underset{R_3}{|}}{R_4-C-O-R_2}}{\underset{|}{O}}}{\overset{\overset{R_1}{|}}{\underset{|}{C}}})_a-(\text{CH}_2-\underset{\underset{\underset{R_6}{|}}{\underset{|}{N-R_5}}}{\overset{\overset{R_1}{|}}{\underset{|}{C}}}-R_7)_b-(\text{CH}_2-\underset{\underset{\underset{R_9}{|}}{\underset{|}{O}}}{\overset{\overset{R_1}{|}}{\underset{|}{C=O}}})_c-(\text{CH}_2-\underset{\underset{\underset{G}{|}}{\underset{|}{O}}}{\overset{\overset{R_1}{|}}{\underset{|}{C=O}}})_d-(\text{CH}_2-\underset{\underset{R_{10}}{|}}{\overset{\overset{R_1}{|}}{\underset{|}{C=O}}})_e-(\text{CH}_2-\underset{\underset{R_{11}}{|}}{\overset{\overset{R_1}{|}}{\underset{|}{C=O}}})_f-(\text{CH}_2-\underset{\underset{R_{12}}{|}}{\overset{\overset{R_1}{|}}{\underset{|}{C=O}}})_g-(\text{CH}_2-\underset{\underset{\text{OH}}{|}}{\overset{\overset{R_1}{|}}{\underset{|}{C=O}}})$$

In the above formula [V], $R_1$ to $R_{10}$, A and G are as defined in the foregoing, $R_{11}$ represents a tertiary alkyl group or 3-oxocyclohexyl group, $R_{12}$ represents methyl group, ethyl group, propyl group, iso-propyl group or n-butyl group, and a is 3 to 60,
b is 0.001 to 10,
c is 0 to 70,
d is 0 to 97,
e is 0 to 30,
f is 0 to 20 and
g is 0 to 30, provided that
$a+d+e \geq 15$, $b+c \geq 40$ and
$a+b+c+d+e+f+g=100$.

$$[VI]$$

$$-(\text{CH}_2-\underset{\underset{\underset{\underset{R_3}{|}}{R_4-C-O-R_2}}{\underset{|}{O}}}{\overset{\overset{R_1}{|}}{\underset{|}{C}}})_a-(\text{CH}_2-\underset{\underset{R_9}{|}}{\overset{\overset{R_1}{|}}{\underset{|}{C=O}}})_b-(\text{CH}_2-\underset{R_{10}}{\overset{\overset{R_1}{|}}{\underset{|}{C=O}}})_c-(\text{CH}_2-\underset{G}{\overset{\overset{R_1}{|}}{\underset{|}{C=O}}})_d-(\text{CH}_2-\underset{R_{11}}{\overset{\overset{R_1}{|}}{\underset{|}{C=O}}})_e-(\text{CH}_2-\underset{R_{12}}{\overset{\overset{R_1}{|}}{\underset{|}{C=O}}})_f-(\text{CH}_2-\underset{\text{OH}}{\overset{\overset{R_1}{|}}{\underset{|}{C=O}}})$$

In the above formula [VI], $R_1$ to $R_4$, $R_9$, $R_{10}$, A, G $R_{11}$ and $R_{12}$ are as defined in the foregoing, and a is 3 to 60,
b is 0 to 70,
c is 0 to 97,
d is 0 to 30,
e is 0 to 20 and
f is 0 to 30, provided that
$a+c+d \geq 15$, $b+c \geq 40$ and
$a+b+c+d+e+f=100$.

The aforementioned resin of the present invention has a weight-average molecular weight of preferably from 2,000 to 200,000. The weight-average molecular weight if less than 2,000 would be undesirable because of the deterioration of heat resistance and dry etching resistance and if exceeding 200,000 would also be undesirable because of the deterioration of developing ability and of the extremely increased viscosity which would deteriorate film forming property.

The resin of the present invention can be produced by a usually used method such as radical polymerization which uses an azo compound or the like as an initiator.

In the positive photoresist composition of the present invention, amount of the aforementioned resin in the total composition is within the range of from 40 to 99% by weight, preferably from 50 to 97% by weight, based on the total resist solid.

Next, the basic low molecular weight compound of the present invention is described.

According to the basic low molecular weight compound of the present invention, the term "low molecular weight" means a molecular weight of from 20 to 1,000, preferably from 50 to 500. Also, the basic low molecular weight compound is a compound which has a specified molecular weight and a single structure and shows a basic property which is stronger than that of phenol. According to the present invention, a nitrogen-containing basic low molecular weight compound is desirable as the basic low molecular weight compound.

Preferred examples of the basic low molecular weight compound include a compound represented by the following general formula (A) or compounds having partial structures represented by the following general formulae (B) to (E).

$$R^{100}-\underset{\underset{R^{102}}{|}}{\overset{\overset{R^{101}}{|}}{N}} \quad (A)$$

$$-\underset{|}{N}-\underset{|}{C}=\underset{|}{N}- \quad (B)$$

$$=\underset{|}{C}-\underset{|}{N}=\underset{|}{C}- \quad (C)$$

$$=\underset{|}{C}-\underset{|}{N}- \quad (D)$$

$$R^{103}-\underset{\underset{|}{|}}{\overset{\overset{R^{104}}{|}}{C}}-\underset{\underset{|}{|}}{\overset{\overset{R^{105}}{|}}{N}}-\underset{|}{\overset{|}{C}}-R^{106} \quad (E)$$

In the above formulae, $R^{100}$ to $R^{102}$ may be the same or different and each represents a hydrogen atom, an alkyl group having 1 to 6 carbon atoms, an aminoalkyl group having 1 to 6 carbon atoms, a hydroxyalkyl group having 1 to 6 carbon atoms or a substituted or unsubstituted aryl group having 6 to 20 carbon atoms. $R^{103}$ to $R^{106}$ may be the same or different and each represents an alkyl group having 1 to 6 carbon atoms. In this case, $R^{100}$ and $R^{101}$ may be linked to each other to form a ring.

More preferred is a nitrogen-containing basic low molecular weight compound which has two or more nitrogen atoms of different partial structures in one molecule, and particularly preferred is a compound which contains both of substituted or unsubstituted amino group and a nitrogen-containing ring structure or a compound having an alkylamino group.

Preferred examples of the basic low molecular weight compound include substituted or unsubstituted guanidine, substituted or unsubstituted aminopyridine, substituted or unsubstituted aminoalkylpyridine, substituted or unsubstituted aminopyrrolidine, substituted or unsubstituted indazole, substituted or unsubstituted pyrazole, substituted or unsubstituted pyrazine, substituted or unsubstituted pyrimidine, substituted or unsubstituted purine, substituted or unsubstituted imidazoline, substituted or unsubstituted pyrazoline, substituted or unsubstituted piperazine, substituted or unsubstituted aminomorpholine, substituted or unsubstituted aminoalkylmorpholine and the like. Preferred examples of the substituent group include amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group and a cyano group.

Though not particularly limited, more preferred examples of the compound include guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl) piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, N-(2-aminoethyl)morpholine and the like.

Most preferred examples of the compound to be used in the present invention are triphenylimidazole, 4-dimethylaminopyridine and 2-dimethylaminopyridine.

These basic low molecular weight compounds may be used alone or as a mixture of two or more.

The basic low molecular weight compound is used in an amount of generally from 0.001 to 10 parts by weight, preferably from 0.01 to 8 parts by weight, based on 100 parts by weight of the resist composition (excluding solvent). The amount if less than 0.001 part by weight would result in insufficient effects of the present invention. On the other hand, the amount if exceeding 10 parts by weight would cause decreased sensitivity and worsened developing ability of unexposed area.

Next, the photo acid generator in the positive photoresist composition of the present invention is described.

It is necessary that the photo acid generator satisfies two properties. That is, (1) transparency for exposed light (in the case of no light breaching) and (2) sufficient photolytic property in order to ensure resist sensitivity. Though it is the present situation that there is no clear guiding principle on molecular designing which satisfies these conflicting requirements, the following cases can be exemplified.

That is, as such a type of acid generator, the aliphatic alkylsulfonium salts, each having 2-oxocyclohexyl group, and N-hydroxysuccinimide sulfonates can be exemplified, which are described in JP-A-7-25846, JP-A-7-28237, JP-A-7-92675 and JP-A-8-27102. Also can be exemplified are sulfonium salts represented by the following general formula (VI), disulfones represented by the following general formula (VII) and compounds represented by the following general formula (VII), which are described for example in *J. Photopolym. Sci. Technol.*, Vol. 7, No. 3, p. 423 (1994).

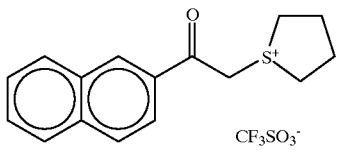

(VI)

(VII)

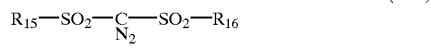

(VIII)

In these formulae, $R_{13}$ to $R_{16}$ may be the same or different and each represents an alkyl group or a cyclic alkyl group.

In addition, N-hydroxymaleinimide sulfonates represented by the following general formula (IX) are also desirable.

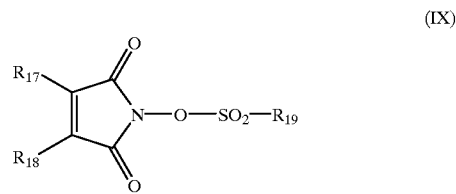

(IX)

In the above formula, $R_{17}$ and $R_{18}$ may be the same or different and each represents a hydrogen atom or an alkyl or cycloalkyl group having 1 to 6 carbon atoms. Alternatively, $R_{17}$ and $R_{18}$ may form a ring by linking together via an alkylene group. $R_{19}$ represents an alkyl group, a perfluoroalkyl group, a cycloalkyl group or a camphor substitution product. Such N-hydroxymaleinimide sulfonates are particularly desirable in terms of light sensitivity.

As the alkyl group having 1 to 6 carbon atoms of $R_{17}$ and $R_{18}$ in the aforementioned general formula (IX), methyl group, ethyl group, propyl group, isopropyl group, n-butyl group, isobutyl group, tert-butyl group, n-pentyl group and n-hexyl group can be exemplified. Among these groups, methyl, ethyl or propyl group is desirable, and methyl or ethyl group is more desirable. Examples of the cycloalkyl group having 6 or less of carbon atoms include cyclopropyl group, cyclopentyl group and cyclohexyl group, and cyclopentyl and cyclohexyl are preferred. With regard to the case in which $R_{17}$ and $R_{18}$ form a ring by linking together via an alkylene group, a case in which they form cyclohexyl group, norbornyl group or tricyclodecanyl group can be exemplified.

Examples of the alkyl group of $Rl_9$ include straight chain alkyl groups having 1 to 20 carbon atoms including methyl, ethyl, propyl and the like groups and branched chain alkyl groups having 1 to 20 carbon atoms including isopropyl, isobutyl, tert-butyl, neopentyl and the like groups. Among these groups, straight or branched alkyl groups having 1 to 16 carbon atoms are desirable, and straight or branched alkyl groups having 4 to 15 carbon atoms are more desirable.

Examples of the perfluoroalkyl group include straight chain perfluoroalkyl groups having 1 to 20 carbon atoms including trifluoromethyl, pentafluoroethyl and the like groups and branched chain perfluoroalkyl groups having 1 to 20 carbon atoms including heptafluoroisopropyl, nonafluoro-tert-butyl and the like groups. Among these groups, straight or branched perfluoroalkyl groups having 1 to 16 carbon atoms are desirable. Examples of the cyclic alkyl group include cyclopentyl, cyclohexyl and the like monocyclic alkyl groups and decalyl, norbornyl, tricyclodecanyl and the like heterocyclic alkyl groups.

Such a photo acid generator is used in the composition in an amount of preferably from 0.1 to 20% by weight, more preferably from 0.5 to 15% by weight, most preferably from 1 to 10% by weight, based on the total solid of the positive photoresist composition.

In addition to the aforementioned photo acid generators, another photo acid generator exemplified in the following may be jointly used in the positive photoresist composition of the present invention.

The following photo acid generating agents which can be used in combination are added to the compositions preferably in an amount of not more than 2% by weight, and more preferably in an amount of not more than 1% by weight, per the solid content of the whole positive type photoresist composition.

Examples of such photo acid generating agents include diazonium salts described in S. I. Schlesinger, *Photogr. Sci. Eng.*, 18, 387 (1974) and T. S. Bal et al., *Polymer*, 21, 423 (1980), ammonium salts described in U.S. Pat. Nos. 4,069,055, 4,069,056 and Re 27,992, and Japanese Patent Application No. 3-140140, phosphonium salts described in D. C. Necker et al., *Macromolecules*, 17, 2468 (1984), C. S. Wen et al., *Tec. Ptoc. Conf. Rad. Curing ASIA*, p. 478, Tokyo, Oct. (1988), U.S. Pat. Nos. 4,069,055 and 4,069,056, iodonium salts described in J. V. Crivello et al., *Macromolecules*, 10 (6), 1307 (1977), *Chem. & Eng. News*, Nov. 28, 31 (1988), European Patent 104,143, U.S. Pat. Nos. 339,049 and 410,201, JP-A-2-150848 and JP-A-2-296514, sulfonium salts described in J. V. Crivello et al., *Polymer, J.* 17, 73 (1985), J. V. Crivello et al., *J. Org. Chem.*, 43, 3055 (1978), W. R. Watt et al., *J. Polymer Sci., Polymer Chem. Ed.*, 22, 1789 (1984), J. V. Crivello et al., *Polymer Bull.*, 14, 279 (1985), J. V. Crivello et al., *Macromolecules*, 14 (5), 1141 (1981), J. V. Crivello et al., *J. Polymer Sci., Polymer Chem. Ed.*, 17, 2877 (1979), European Patents 370,693, 3,902,114, 233, 567, 297,443 and 297,442, U.S. Pat. Nos. 4,933,377, 161, 881, 410,201, 339,049, 4,760,013, 4,734,444 and 2,833,827, and German Patents 2,904,626, 3,604,580 and 3,604,581, selenonium described in J. V. Crivello et al., *Macromolecules*, 10 (6), 1307 (1977) and J. V. Crivello et al., *J. Polymer Sci., Polymer Chem. Ed.*, 17, 1047 (1979), onium salts such as arsonium salts described in C. S. Wen et al., *Tec. Ptoc. Conf. Rad. Curing ASIA*, p. 478, Tokyo, Oct. (1988), organic halogen compounds described in U.S. Pat. No. 3,905,815, JP-B-46-4605 (the term "JP-B" as used herein means an "examined Japanese patent publication"), JP-A-48-36281, JP-A-55-32070, JP-A-60-239736, JP-A-61-169835, JP-A-61-169837, JP-A-62-58241, JP-A-62-212401, JP-A-63-70243 and JP-A-63-298339, organic metal/organic halides described in K. Meier et al., *J. Rad. Curing*, 13 (4), 26 (1986), T. P. Gill et al., *Inorg. Chem.*, 19, 3007 (1980), D. Astruc, *Acc. Chem. Res.*, 19 (12), 377 (1896) and JP-A-2-161445, photo acid generating agents having o-nitrobenzyl type protective groups described in S. Hayase et al., *J. Polymer Sci.*, 25, 753 (1987), E. Reichmanis et al., *J. Polymer Sci. Polymer Chem. Ed.*, 23, 1 (1985), Q. Zhu et al., *J. Photochem.*, 36, 85, 39, 317 (1987), B. Amit et al., *Tetrahedron Lett.*, (24), 2205 (1973), D. H. R. Barton et al., *J. Chem. Soc.*, 35, 71 (1965), P. M. Collins et al., *J. Chem. Soc.*, Perkin I, 1695 (1975), M. Rudinstein et al., *Tetrahedron Lett.*, (17), 1445 (1975), J. W. Walker et al., *J. Am. Chem. Soc.*, 110, 7170 (1988), S. C. Busman et al., *J. Imaging Technol.*, 11 (4), 191 (1985), H. M. Houlihan et al., *Macromolecules*, 21, 2001 (1988), P. M. Collins et al., *J. Chem. Soc., Chem. Commun.*, 532 (1972), S. Hayase et al., *Macromolecules*, 18, 1799 (1985), E. Reichmanis et al., *J. Electrochem. Soc., Solid State Sci. Technol.*, 130 (6), F. M. Houlihan et al., *Macromolecules*, 21, 2001 (1988), European Patents 290,750, 046,083, 156,535, 271,851 and 388,343, U.S. Pat. Nos. 3,901,710 and 4,181,531, JP-A-60-198538 and JP-A-53-133022, compounds producing sulfonic acids by photolysis which are represented by iminosulfonates described in M. Tunooka et al., *Polymer Preprints Japan*, 35 (8), G. Berner et al., *J. Rad. Curing*, 13 (4), W. J. Mijs et al., *Coating Technol.*, 55 (697), 45 (1983), Akzo, H. Adachi et al., *Polymer Preprints Japan*, 37 (3), European Patents 199,672, 84,515, 44,115 and 101,122, U.S. Pat. Nos. 618, 564, 4,371,605 and 4,431,774, JP-A-64-18143, JP-A-2-245756 and Japanese Patent Application No. 3-140109, and disulfone compounds described in JP-A-61-166544.

Further, compounds in which these groups or compounds generating acids with light are introduced into their main chains or side chains can be used. Examples of such compounds are described in M. E. Woodhouse et al., *J. Am. Chem. Soc.*, 104, 5586 (1982), S. P. Pappas et al., *J. Imaging Sci.*, 30 (5), 218 (1986), S. Kondo et al., *Makromol. Chem., Rapid Commun.*, 9, 625 (1988), Y. Yamada et al., *Makromol. Chem.*, 152, 153, 163 (1972), J. V. Crivello et al., *J. Polymer Sci. Polymer Chem. Ed.*, 17, 3845 (1979), U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029.

Further, compounds generating acids with light can also be used which are described in V. N. R. Pillai *Synthesis*, (1) 1 (1980), A. Abad et al., *Tetrahedron Lett.*, (47), 4555 (1971), D. H. R. Barton et al., *J. Chem. Soc.*, (C), 329 (1970), U.S. Pat. No. 3,779,778 and European Patent 126, 712.

Of the above-mentioned compounds which can be used in combination and are decomposed by irradiation of active light rays or radiation to generate acids, compounds particularly effectively used are described below.

(1) Oxazole derivatives substituted by trihalomethyl groups, which are represented by the following general formula (PAG1), or S-triazine derivatives represented by the following general formula (PGA2)

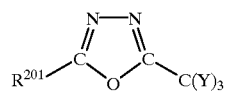
(PAG1)

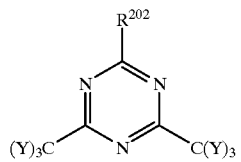
(PAG2)

where $R^{201}$ represents a substituted or unsubstituted aryl or alkenyl group; $R^{202}$ represents a substituted or unsubstituted aryl, alkenyl or alkyl group, or $—C(Y)_3$; and Y represents a achlorine atom or a bromine atom.

Specific examples thereof include but are not limited to the following compounds:
(PAG1-1)
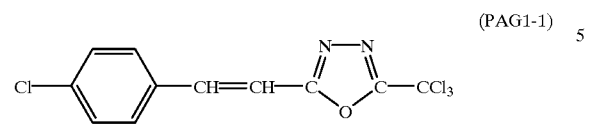
(PAG1-2)
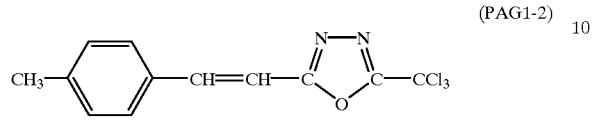
(PAG1-3)
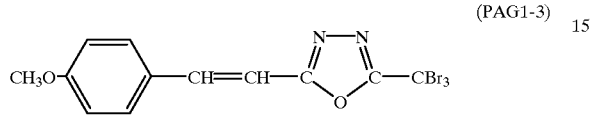
(PAG1-4)
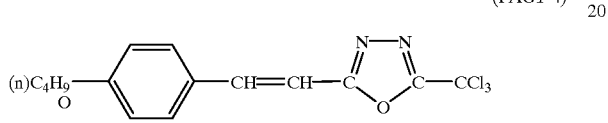
(PAG1-5)
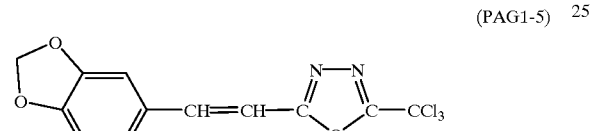
(PAG1-6)
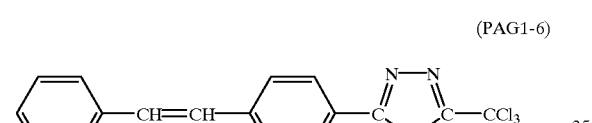
(PAG1-7)
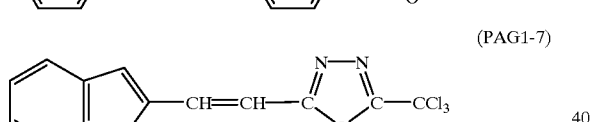
(PAG1-8)
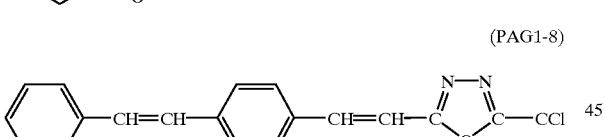
(PAG2-1)
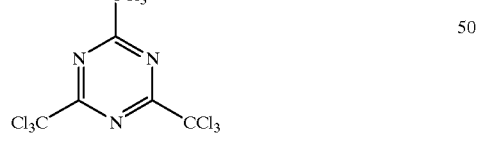
(PAG2-2)
(PAG2-3)
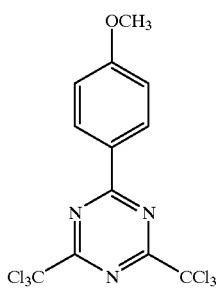
(PAG2-4)
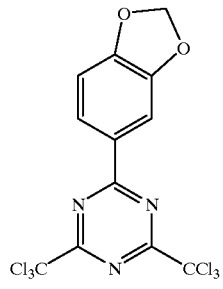
(PAG2-5)
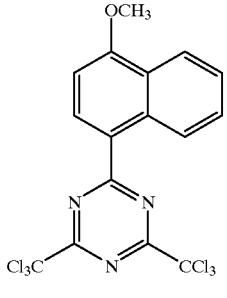
(PAG2-6)
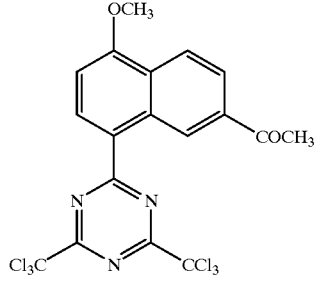
(PAG2-7)
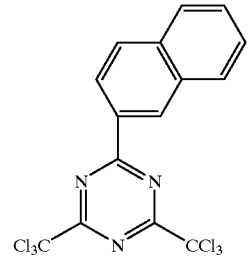

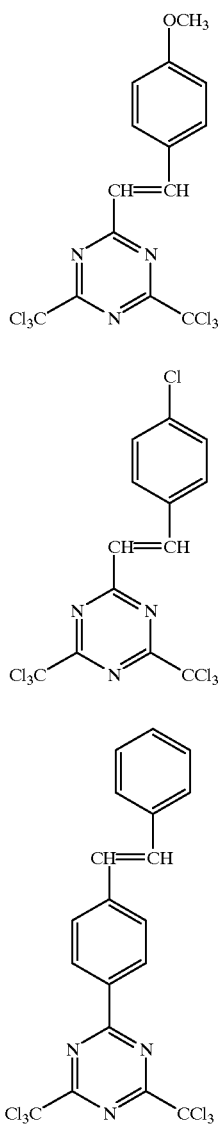

(PAG2-8)

(PAG2-9)

(PAG2-10)

(2) Iodonium salts represented by the following general formula (PAG3) or sulfonium salts represented by the following general formula (PAG4)

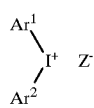

(PAG3)

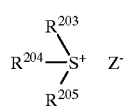

(PAG4)

wherein $Ar^1$ and $Ar^2$ each independently represents a substituted or unsubstituted aryl group. Preferred examples of the substituent groups include alkyl, haloalkyl, cycloalkyl, aryl, alkoxyl, nitro, carboxyl, alkoxycarbonyl, hydroxyl, mercapto and halogen atoms.

$R^{203}$, $R^{204}$ and $R^{205}$ each independently represents a substituted or unsubstituted alkyl or aryl group, and preferably an aryl group having 6 to 14 carbon atoms, an alkyl group having 1 to 8 carbon atoms or a substituted derivative thereof. Preferred examples of the substituent groups for aryl include alkoxyl of 1 to 8 carbon atoms, alkyl of 1 to 8 carbon atoms, nitro, carboxyl, hydroxyl and halogen atoms, and preferred examples thereof for alkyl include alkoxyl of 1 to 8 carbon atoms, carboxyl and alkoxycarbonyl.

$Z^-$ represents a counter ion such as a perfluoroalkanesulfonic acid anion, for example, $CF_3SO_3^-$, or a pentafluorobenzenesulfonic acid anion.

Two of $R^{203}$, $R^{204}$ and $R^{205}$, and $Ar_1$ and $Ar_2$ may combine together by each single bond or substituent group.

Specific examples thereof include but are not limited to the following compounds:

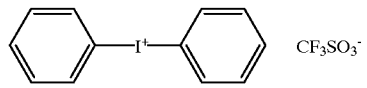
(PAG3-1)

(PAG3-2)

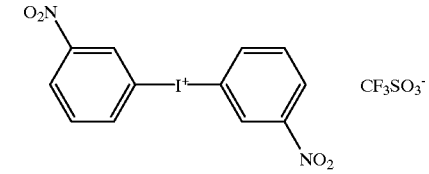
(PAG3-3)

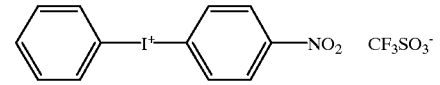
(PAG3-4)

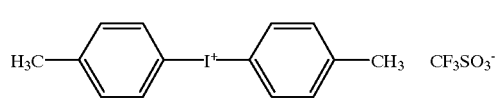
(PAG3-5)

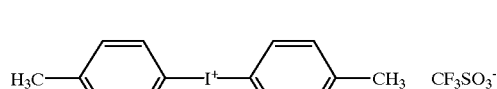
(PAG3-6)

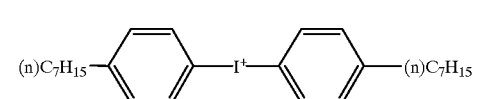
(PAG3-7)

(PAG3-8)

(PAG3-9)

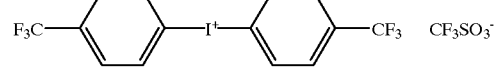

(PAG3-10)
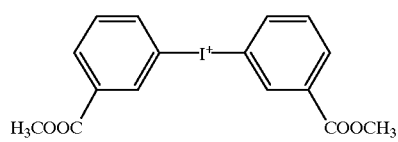
(PAG3-11)
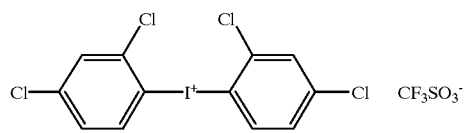
(PAG3-12)
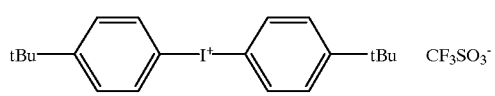
(PAG3-13)
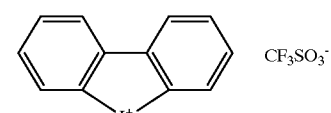
(PAG3-14)
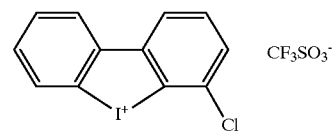
(PAG3-15)
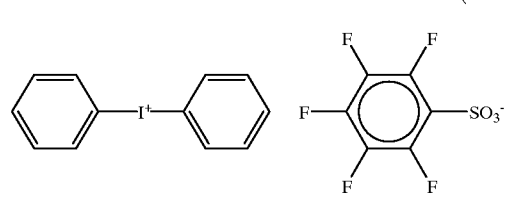
(PAG3-16)
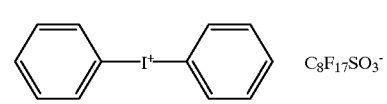
(PAG4-1)
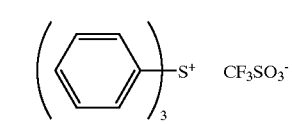
(PAG4-2)
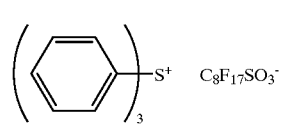
(PAG4-3)
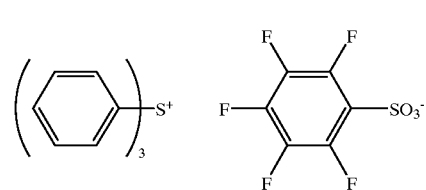
(PAG4-4)
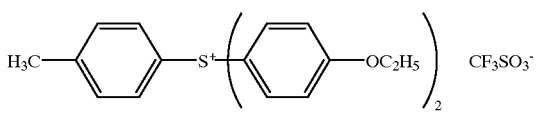
(PAG4-5)
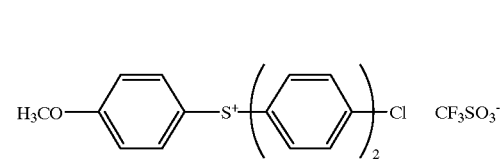
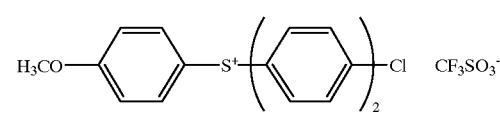
(PAG4-6)
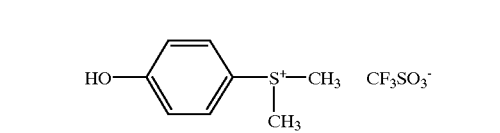
(PAG4-7)
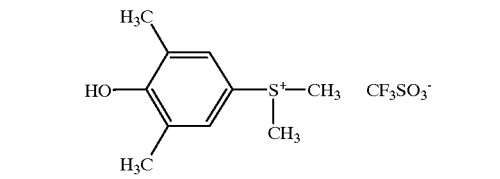
(PAG4-8)
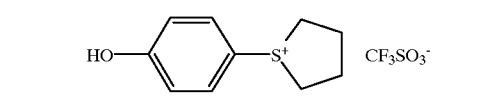
(PAG4-9)
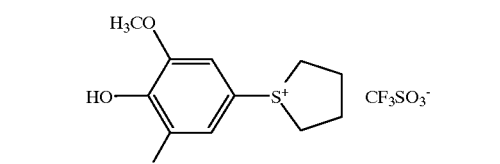
(PAG4-10)
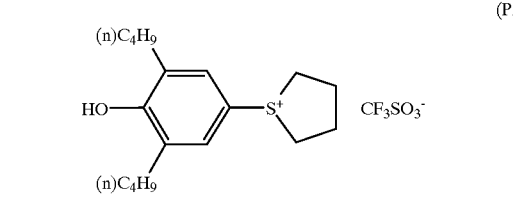
(PAG4-11)
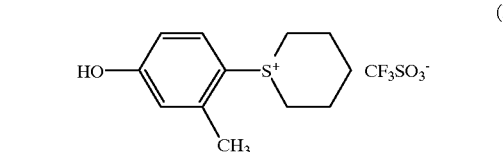
(PAG4-12)
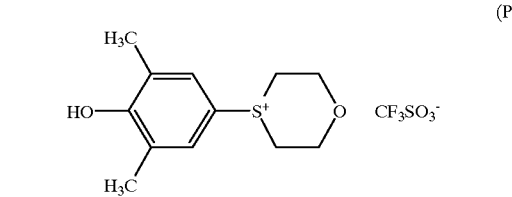

(PAG4-13) 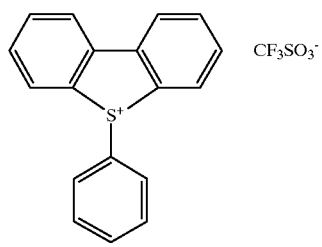

(PAG4-14) 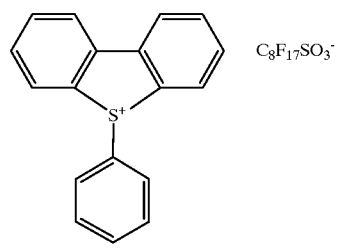

(PAG4-15) 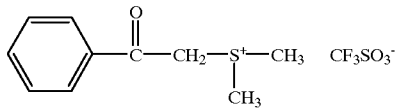

(PAG4-16) 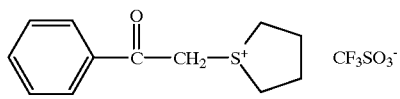

(PAG4-17) 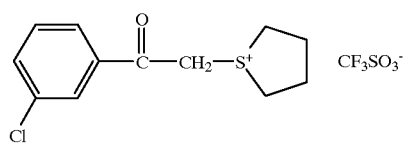

(PAG4-18) 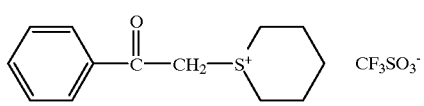

(PAG4-19) 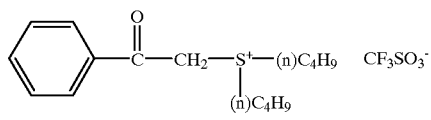

(PAG4-20) 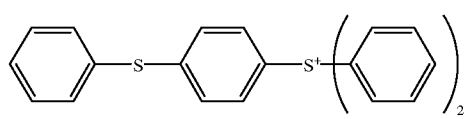

(PAG4-21) 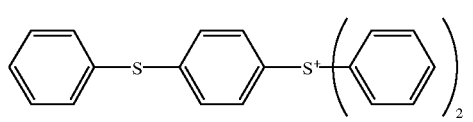

(PAG4-22) 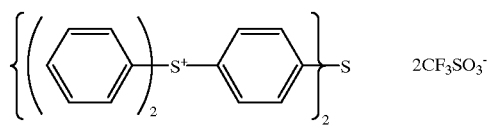

(PAG4-23) 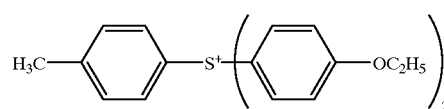

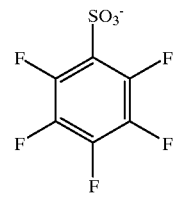

(PAG4-24) 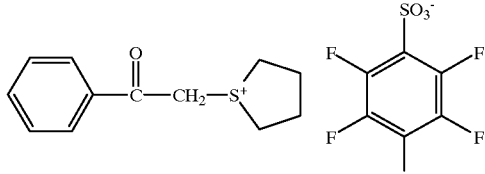 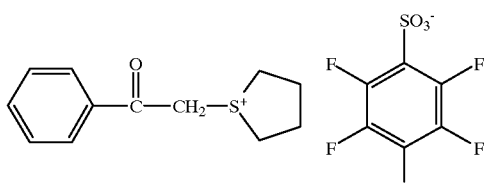

The above-mentioned onium salts represented by general formulas (PAG3) and (PAG4) are known, and can be synthesized, for example, by methods described in J. W. Knapczyk et al., *J. Am. Chem. Soc.*, 91, 145 (1969), A. L. Maycok et al., *J. Org. Chem.*, 35, 2532 (1970), E. Goethas et al., *Bull. Soc. Chem. Belg.*, 73, 546 (1964), H. M. Leicester, *J. Am. Chem. Soc.*, 51, 3587 (1929), J. V. Crivello et al., *J. Polymer Chem. Ed.*, 18, 2677 (1980), U.S. Pat. Nos. 2,807,648 and 4,247,473, and JP-A-53-101331.

(3) Disulfone derivatives represented by the following general formula (PAG5) or iminosulfonate derivatives represented by the following general formula (PAG6)

(PAG5)

(PAG6)
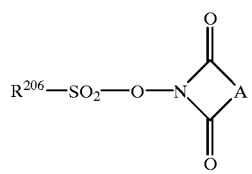

wherein $Ar^3$ and $Ar^4$ each independently represents a substituted or unsubstituted aryl group; $R^{206}$ represents a substituted or unsubstituted alkyl or aryl group; and A represents a substituted or unsubstituted alkylene, alkenylene or arylene group.

Specific examples thereof include but are not limited to the following compounds:

(PAG5-1)
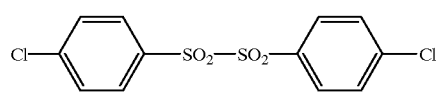
(PAG5-2)
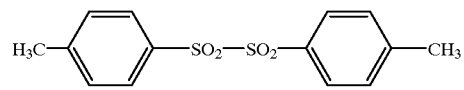
(PAG5-3)
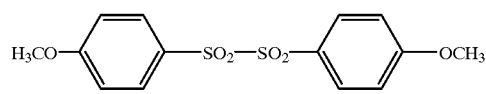
(PAG5-4)
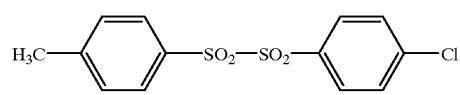
(PAG5-5)
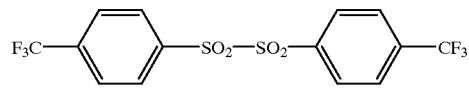
(PAG5-6)
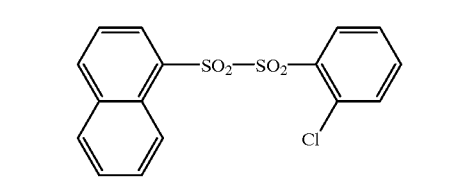
(PAG5-7)
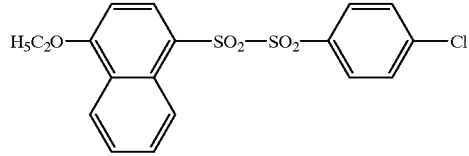
(PAG5-8)
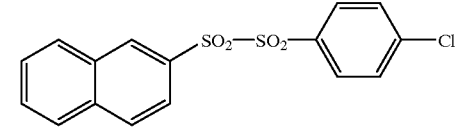
(PAG5-9)
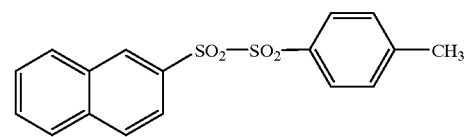
(PAG5-10)
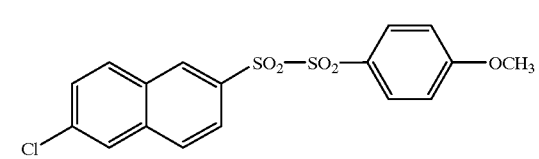
-continued
(PAG5-11)
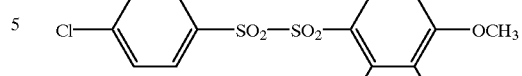
(PAG5-12)
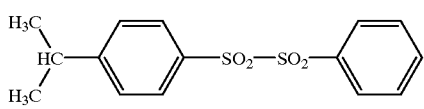
(PAG5-13)
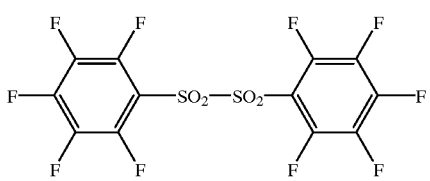
(PAG5-14)
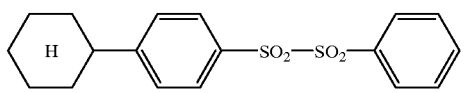
(PAG6-1)
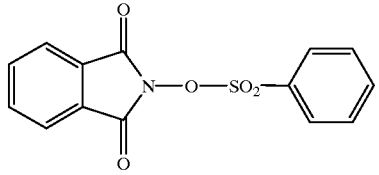
(PAG6-2)
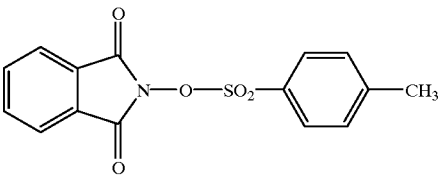
(PAG6-3)
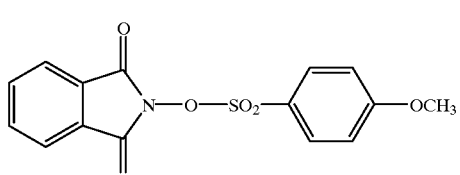
(PAG6-4)
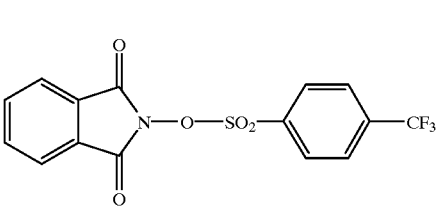

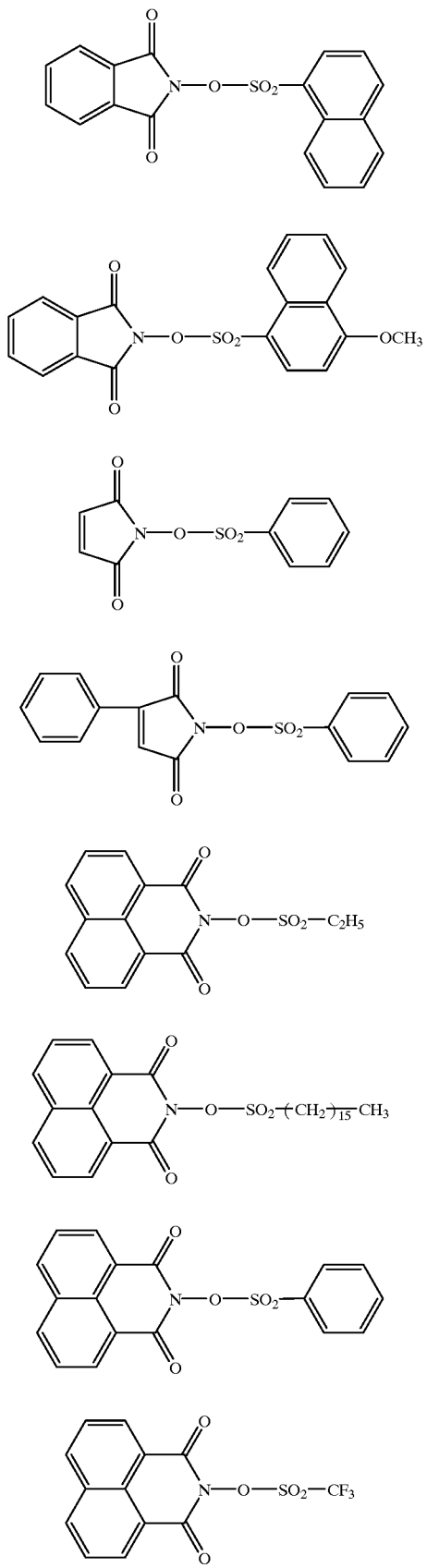

(PAG6-5)
(PAG6-6)
(PAG6-7)
(PAG6-8)
(PAG6-9)
(PAG6-10)
(PAG6-11)
(PAG6-12)

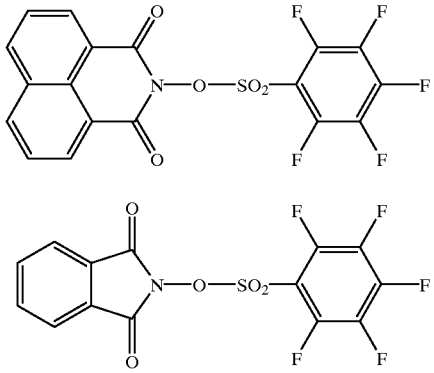

(PAG6-13)
PAG6-14

Appropriate alkali-soluble low molecular weight compounds may be added to the positive type photoresist compositions for improving alkali solubility in the systems or controlling the glass transition temperature of the systems to prevent the films from becoming brittle and the heat resistance from being deteriorated. The alkali-soluble low molecular weight compounds include compounds having acidic groups in their molecules such as dialkylsulfonamide compounds, dialkyl-sulfonylimide (—$SO_2$—NH—CO—) compounds and dialkyldisulfonyl-imide (—$SO_2$—NH—$SO_2$—) compounds. The content of the alkali-soluble low molecular weight compound is preferably 40% by weight or less, more preferably 30% by weight or less, and most preferably 25% by weight or less, based on the above-mentioned binder resin.

The compositions of the present invention are preferably used as solutions thereof in specific solvents. Such solvents may be any, as long as they are organic solvents which sufficiently dissolve the respective solid components and can provide the solutions forming uniform coated films by methods such as spin coating. Further, they may be used alone or as a mixture of two or more of them. Specific examples thereof include but are not limited to n-propyl alcohol, isopropyl alcohol, n-butyl alcohol, t-butyl alcohol, methyl cellosolve acetate, ethyl cellosolve acetate, propylene glycol monoethyl ether acetate, methyl lactate, ethyl lactate, 2-methoxybutyl acetate, 2-ethoxyethyl acetate, methyl pyruvate, ethyl pyruvate, methyl 3-methoxypropionate, ethyl 3-methoxypropionate, N-methyl-2-pyrrolidinone, cyclohexanone, cyclopentanone, cyclohexanol, methyl ethyl ketone, 1,4-dioxane, ethylene glycol monomethyl ether, ethylene glycol monomethyl ether acetate, ethylene glycol monoethyl ether, ethylene glycol monoisopropyl ether, diethylene glycol dimethyl ether and 2-heptanone.

The positive type photoresist compositions of the present invention may further contain other components such as surfactants, pigments, coating improvers and dyes, if necessary.

Such positive type photoresist compositions of the present invention are applied onto substrates to form thin films. The thickness of the coated films is preferably 0.4 μm to 1.5 μm. As exposure means, ones in which the exposure wavelength is included within the range of 170 nm to 220 nm, such as ArF excimer laser stepper exposure, are preferred, and ArF excimer laser stepper exposure is particularly preferred.

EXAMPLES

The following illustratively describes the present invention with reference to examples, though the scope of the present invention is not restricted thereby.

Synthesis Example (1)
Synthesis of Monomer [I-A-1]

A 72 g portion of acrylic acid and 140 g of ethyl vinyl ether were dissolved in 50 ml of MIBK to which was subsequently added 1 g of 2-ethylhexyl phosphate slowly, and the resulting mixture was stirred at room temperature for 16 hours. After completion of the reaction, the reaction mixture was adjusted to a basic condition by adding an excess amount of triethylamine and then washed by adding distilled water. Excess ethyl vinyl ether was evaporated from the thus obtained oil layer under normal pressure, the reaction solvent and the like were then evaporated under a reduced pressure and finally the desired monomer, [I-A-1], was collected by distillation under a reduced pressure.

Synthesis Example (2)
Synthesis of Monomer [I-C-1]

The monomer [I-C-1] was obtained by carrying out the reaction of Synthesis Example (1), except that the aforementioned acrylic acid of Synthesis Example (1) was replaced by Aronix M-5500 having the following structure manufactured by Toagosei Chemical Industry Co., Ltd., and purifying the product making use of a silica gel column chromatography in stead of the distillation under a reduced pressure.

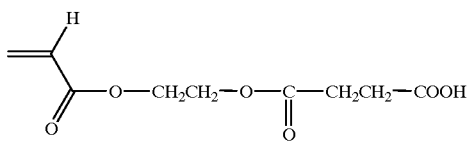

Synthesis Example (3)
Synthesis of Monomer [I-F-2]

The monomer [I-F-2] was synthesized by carrying out the same reaction of Synthesis Example (1), except that acrylic acid was replaced by a terminal carboxylic acid methacrylate which has been synthesized by allowing 3-hydroxypropionic acid to react with Calens MOI having the following structure manufactured by Showa Denko K.K.

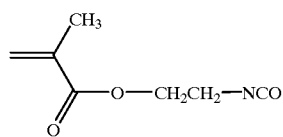

Synthesis Example (4)
Synthesis of Monomer [II-A-1]

The desired monomer, [II-A-1], was synthesized by carrying out ester interchange reaction between methyl acrylate and N-(2-hydroxyethyl)dimethylamine under an acidic condition.

Synthesis Example (5)
Synthesis of Monomer [II-A-9]

The desired monomer, [II-A-9], was synthesized in the same manner as described in Synthesis Example (4) except that N-(2-hydroxyethyl)morpholine was used in stead of N-(2-hydroxyethyl)dimethylamine.

Synthesis Example (6)
Synthesis of Monomer [II-A-12]

The desired monomer, [II-A-12], was synthesized by carrying out the reaction of methyl methacrylate with N-(2-hydroxypropyl)dimethylamine in the same manner as described in Synthesis Example (4).

Synthesis Example (7)
Synthesis of Resin A

After dissolving 17.6 g of tricyclodecanyl methacrylate, 8.7 g of the monomer [I-A-1], 3.6 g of acrylic acid and 1.7 g of the monomer [II-A-1] in 74 g of THF (tetrahydrofuran), nitrogen was bubbled for 30 minutes into the reaction solution which was subsequently heated at 65° C. To this was added 500 mg of V-65 (manufactured by Wako Pure Chemical Industries Ltd.) as an initiator, followed by 8 hours of stirring with heating as such. Thereafter, another 100 mg of V-65 (manufactured by Wako Pure Chemical Industries Ltd.) was added, and the heated stirring was continued for additional 2 hours. After completion of the heating, the reaction solution was returned to room temperature and mixed with 100 g of THF, and the thus diluted reaction product was re-precipitated in a mixed solvent consisting of 2 L distilled water/2 L methanol to recover the desired resin A as white powder.

When analyzed by GPC, the thus obtained copolymer was found to have a weight-average molecular weight of 22,000 as calculated in standard polystyrene equivalent.

Synthesis Example (8)
Synthesis of Resin B

After dissolving 17.6 g of tricyclodecanyl methacrylate, 8.7 g of the monomer [I-A-1], 3.6 g of acrylic acid and 1.9 g of the monomer [II-A-9] in 74 g of THF, nitrogen was bubbled for 30 minutes into the reaction solution which was subsequently heated at 65° C. To this was added 500 mg of V-65 (manufactured by Wako Pure Chemical Industries Ltd.) as an initiator, followed by 8 hours of stirring with heating as such. Thereafter, another 100 mg of V-65 (manufactured by Wako Pure Chemical Industries Ltd.) was added, and the heated stirring was continued for additional 2 hours. After completion of the heating, the reaction solution was returned to room temperature and mixed with 100 g of THF, and the thus diluted reaction product was re-precipitated in a mixed solvent consisting of 2 L distilled water/2 L methanol to recover the desired resin B as white powder.

When analyzed by GPC, the thus obtained copolymer was found to have a weight-average molecular weight of 22,500 as calculated in standard polystyrene equivalent.

Synthesis Example (9)
Synthesis of Resin C

After dissolving 17.6 g of tricyclodecanyl methacrylate, 17.3 g of the monomer [I-C-1], 3.6 g of acrylic acid and 1.9 g of the monomer [II-A-9] in 94 g of THF, nitrogen was bubbled for 30 minutes into the reaction solution which was subsequently heated at 65° C. To this was added 500 mg of V-65 (manufactured by Wako Pure Chemical Industries Ltd.) as an initiator, followed by 8 hours of stirring with heating as such. Thereafter, another 100 mg of V-65 (manufactured by Wako Pure Chemical Industries Ltd.) was added, and the heated stirring was continued for additional 2 hours. After completion of the heating, the reaction solution was returned to room temperature and mixed with 100 g of THF, and the thus diluted reaction product was re-precipitated in a mixed solvent consisting of 2 L distilled water/2 L methanol to recover the desired resin C as white powder.

When analyzed by GPC, the thus obtained copolymer was found to have a weight-average molecular weight of 24,500 as calculated in standard polystyrene equivalent.

Synthesis Example (10)
Synthesis of Resin D

After dissolving 17.6 g of tricyclodecanyl methacrylate, 18.2 g of the monomer [I-F-2], 3.6 g of acrylic acid and 1.6 g of the monomer [II-A-12] in 96 g of THF, nitrogen was bubbled for 30 minutes into the reaction solution which was subsequently heated at 65° C. To this was added 1 g of V-65 (manufactured by Wako Pure Chemical Industries Ltd.) as an initiator, followed by 8 hours of stirring with heating as such. Thereafter, another 200 mg of V-65 (manufactured by Wako Pure Chemical Industries Ltd.) was added, and the heated stirring was continued for additional 2 hours. After completion of the heating, the reaction solution was returned to room temperature and mixed with 100 g of THF, and the thus diluted reaction product was re-precipitated in a mixed solvent consisting of 2 L distilled water/2 L methanol to recover the desired resin D as white powder.

When analyzed by GPC, the thus obtained copolymer was found to have a weight-average molecular weight of 17,500 as calculated in standard polystyrene equivalent.

Synthesis Example (11)
Synthesis of Resin E for Comparison Use

After dissolving 17.6 g of tricyclodecanyl methacrylate, 8.7 g of the monomer [I-A-1] and 3.6 g of acrylic acid in 70 g of THF, nitrogen was bubbled for 30 minutes into the reaction solution which was subsequently heated at 65° C. To this was added 500 mg of V-65 (manufactured by Wako Pure Chemical Industries Ltd.) as an initiator, followed by 8 hours of stirring with heating as such. Thereafter, another 100 mg of V-65 (manufactured by Wako Pure Chemical Industries Ltd.) was added, and the heated stirring was continued for additional 2 hours. After completion of the heating, the reaction solution was returned to room temperature and mixed with 100 g of THF, and the thus diluted reaction product was re-precipitated in a mixed solvent consisting of 2 L distilled water/2 L methanol to recover the desired resin E as white powder.

When analyzed by GPC, the thus obtained copolymer was found to have a weight-average molecular weight of 21,800 as calculated in standard polystyrene equivalent.

Synthesis Example (12)
Synthesis of Resin F for Comparison Use

After dissolving 17.6 g of tricyclodecanyl methacrylate, 17.3 g of the monomer [I-C-1] and 3.6 g of acrylic acid in 90 g of THF, nitrogen was bubbled for 30 minutes into the reaction solution which was subsequently heated at 65° C. To this was added 500 mg of V-65 (manufactured by Wako Pure Chemical Industries Ltd.) as an initiator, followed by 8 hours of stirring with heating as such. Thereafter, another 100 mg of V-65 (manufactured by Wako Pure Chemical Industries Ltd.) was added, and the heated stirring was continued for additional 2 hours. After completion of the heating, the reaction solution was returned to room temperature and mixed with 100 g of THF, and the thus diluted reaction product was re-precipitated in a mixed solvent consisting of 2 L distilled water/2 L methanol to recover the desired resin F as white powder.

When analyzed by GPC, the thus obtained copolymer was found to have a weight-average molecular weight of 25,000 as calculated in standard polystyrene equivalent.

Synthesis Example (13)
Synthesis of Resin G for Comparison Use

After dissolving 17.6 g of tricyclodecanyl methacrylate, 18.2 g of the monomer [I-F-1] and 3.6 g of acrylic acid in 90 g of THF, nitrogen was bubbled for 30 minutes into the reaction solution which was subsequently heated at 65° C. To this was added 1 g of V-65 (manufactured by Wako Pure Chemical Industries Ltd.) as an initiator, followed by 8 hours of stirring with heating as such. Thereafter, another 200 mg of V-65 (manufactured by Wako Pure Chemical Industries Ltd.) was added, and the heated stirring was continued for additional 2 hours. After completion of the heating, the reaction solution was returned to room temperature and mixed with 100 g of THF, and the thus diluted reaction product was re-precipitated in a mixed solvent consisting of 2 L distilled water/2 L methanol to recover the desired resin G as white powder.

When analyzed by GPC, the thus obtained copolymer was found to have a weight-average molecular weight of 17,000 as calculated in standard polystyrene equivalent.

Synthesis Example (14)
Synthesis of Photo Acid Generator-(1)

An 8 g portion of sodium hydroxide and 14 g of hydroxyamine hydrochloride were dissolved in 200 ml of distilled water, and the solution was mixed with 25 g of dimethyl maleate anhydride and stirred at room temperature for 5 hours and then at 100° C. for 3 hours. After completion of the reaction, this was mixed with hydrochloric acid aqueous solution, saturated with sodium chloride and then extracted with ethyl acetate. The thus obtained ethyl acetate solution was concentrated to ⅓ and mixed with toluene, and the concentration step was repeated to obtain 15 g of an N-hydroxymaleinimide compound.

A 4.2 g portion of the thus synthesized N-hydroxymaleinimide compound was dissolved in dichloromethane to which, while cooling with water, was subsequently added dropwise 8.5 g of trifluoromethane sulfonate anhydride spending 1 hour. After further adding dropwise 2.8 g of pyridine spending 2 hours, the ice bath was removed and the resulting reaction mixture was warmed up to room temperature and stirred as such for 10 hours. After completion of the reaction, the reaction solution was washed with distilled water and the like, concentrated and mixed with hexane to effect crystallization and then the hexane layer was concentrated to obtain 10 g of the desired product.

Based on $^{13}C$ NMR and the like analyses, the following structure was confirmed.

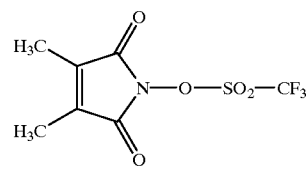

Examples 1 to 4 and Comparative Examples 1 to 3

A 1.5 g portion of each of the resins A to G synthesized in the aforementioned Synthesis Examples and 0.1 g of the photo acid generator-(1) were dissolved in PGMEA (propylene glycol monoethyl ether acetate) to a solid content of 14%, and the solution was then filtered through a microfilter of 0.1 μm to prepare respective positive photoresist compositions. Their formulations are shown in the following Table 1.

(Evaluation Test)

Each of the thus obtained positive photoresist composition solutions was coated on a silicon wafer making use of a spin coater and dried at 120° C. for 90 seconds to prepare a positive photoresist film of about 0.5 μm in thickness which was then exposed to ArF eximer laser (193 nm). After the exposure, the film was subjected to 90 seconds of heat treatment at 110° C., developed with 2.38% tetramethylammonium hydroxide aqueous solution and then rinsed with distilled water to obtain a resist pattern profile.

[Optical Density]

A 1 g portion of each of the resins A to C of the present invention synthesized in the foregoing, m/p-cresol novolak resin or VP-8000 manufactured by Nippon Soda was dissolved in 2-heptanone to prepare a solution having a solid content concentration of 15%. This solution was filtered through a 0.20 μm filter. The thus obtained polymer solution was coated on a quartz glass substrate making use of a spinner and dried at 120° C. for 60 seconds to prepare a film of 1.0 μm in thickness.

Optical density of the thus obtained paint film was measured at 193 nm using an ultraviolet ray absorption apparatus. The results are shown below.

Resin A: 0.10 $\mu^{-1}$
Resin B: 0.12 $\mu^{-1}$
Resin C: 0.11 $\mu^{-1}$
Resin D: 0.13 $\mu^{-1}$
m/p-Cresol novolak resin: 1.0 $\mu^{-1}$ or more
VP-8000 mfd. by Nippon Soda: 1.0 $\mu^{-1}$ or more Based on these results, it was revealed that the resins of the present invention have high transparency at an exposure wave length region of from 170 to 220 nm, which is the target of the present invention, whereas the novolak resin conventionally used in i-line resists and the like and the polyhydroxystyrene resin broadly used as a resin for KrF eximer laser resists have a problem in terms of transparency.

[Relative Sensitivity]

By defining an exposure value which reproduces a large pattern of 1.0 μm as the sensitivity, and the resist sensitivity of Example 1 to ArF eximer laser exposure as 1, relative sensitivity of the resists of other than Example 1 was calculated based on the following formula.

sensitivity of other than Ex. 1/sensitivity of Ex. 1

[Aging Stability]

After one month of storage at 30° C., sensitivity of each resist prepared in the above was measured by the above-described method to evaluate the resist based on the coefficient of variation from its sensitivity before the storage, and it was also evaluated based on the coefficient of variation of the film thickness loss value, which is a rate of change calculated by observing the profile of un-exposed part under a scanning electron microscope (SEM) to measure thickness of the film after development, measuring changes in the thickness of film before exposure and after development, before and after the aging storage, and dividing the measured value by the film thickness before exposure.

The results are shown in Table 1

TABLE 1

| No. | Resin used | Relative sensitivity | Variation of sensitivity | Variation of film thickness loss |
|---|---|---|---|---|
| Example 1 | A | 1.0 | 5% or less | 5% or less |
| Example 2 | B | 0.9 | 5% or less | 5% or less |
| Example 3 | C | 1.1 | 5% or less | 5% or less |
| Example 4 | D | 0.9 | 5% or less | 5% or less |
| Comparative Ex. 1 | E | 0.9 | 50% | 45% |
| Comparative Ex. 2 | F | 0.9 | 40% | 50% |

TABLE 1-continued

| No. | Resin used | Relative sensitivity | Variation of sensitivity | Variation of film thickness loss |
|---|---|---|---|---|
| Comparative Ex. 3 | G | 1.0 | 55% | 60% |

All of Comparative Examples 1 to 3 have problems in terms of the variation of sensitivity and film thickness loss with lapse of time. On the other hand, all of Examples 1 to 4 concerning the positive photoresist composition of the present invention are at satisfactory levels. In other words, the inventive composition is suited for lithography which uses far ultraviolet rays including ArF eximer laser exposure.

Synthesis Example (14)

Synthesis of Resin H

After dissolving 17.6 g of tricyclodecanyl methacrylate, 8.7 g of the monomer [I-A-1] and 3.6 g of acrylic acid in 70 g of THF, nitrogen was bubbled for 30 minutes into the reaction solution which was subsequently heated at 65° C. To this was added 500 mg of v-65 (manufactured by Wako Pure Chemical Industries Ltd.) as an initiator, followed by 8 hours of stirring with heating as such. Thereafter, another 100 mg of V-65 (manufactured by Wako Pure Chemical Industries Ltd.) was added, and the heated stirring was continued for additional 2 hours. After completion of the heating, the reaction solution was returned to room temperature and mixed with 100 g of THF, and the thus diluted reaction product was re-precipitated in a mixed solvent consisting of 2 L distilled water/2 L methanol to recover the desired resin H as white powder.

When analyzed by GPC, the thus obtained copolymer was found to have a weight-average molecular weight of 21,800 as calculated in standard polystyrene equivalent.

Synthesis Example (15)

Synthesis of Resin I

After dissolving 17.6 g of tricyclodecanyl methacrylate, 17.3 g of the monomer [I-C-1] and 3.6 g of acrylic acid in 90 g of THF, nitrogen wasbubbled for 30 minutes into the reaction solution which was subsequently heated at 65° C. To this was added 500 mg of V-65 (manufactured by Wako Pure Chemical Industries Ltd.) as an initiator, followed by 8 hours of stirring with heating as such. Thereafter, another 100 mg of V-65 (manufactured by Wako Pure Chemical Industries Ltd.) was added, and the heated stirring was continued for additional 2 hours. After completion of the heating, the reaction solution was returned to room temperature and mixed with 100 g of THF, and the thus diluted reaction product was re-precipitated in a mixed solvent consisting of 2 L distilled water/2 L methanol to recover the desired resin I as white powder.

When analyzed by GPC, the thus obtained copolymer was found to have a weight-average molecular weight of 25,000 as calculated in standard polystyrene equivalent.

Synthesis Example (16)

Synthesis of Resin J

After dissolving 17.6 g of tricyclodecanyl methacrylate, 18.2 g of the monomer [I-F-2] and 3.6 g of acrylic acid in 92 g of THF, nitrogen was bubbled for 30 minutes into the reaction solution which was subsequently heated at 65° C. To this was added 1 g of V-65 (manufactured by Wako Pure Chemical Industries Ltd.) as an initiator, followed by 8 hours of stirring with heating as such. Thereafter, another 200 mg of V-65 (manufactured by Wako Pure Chemical Industries Ltd.) was added, and the heated stirring was continued for additional 2 hours. After completion of the heating, the reaction solution was returned to room temperature and mixed with 100 g of THF, and the thus diluted reaction product was re-precipitated in a mixed solvent consisting of 2 L distilled water/2 L methanol to recover the desired resin J as white powder.

When analyzed by GPC, the thus obtained copolymer was found to have a weight-average molecular weight of 17,000 as calculated in standard polystyrene equivalent.

Examples 5 to 13 and Comparative Examples 4 to 6

A 1.5 g portion of each of the resins H to J synthesized in the aforementioned Synthesis Examples, 0.1 g of the photo acid generator-(1) and each of the basic low molecular weight compounds shown in the following Table 2 were dissolved in PGMEA to a solid content of 14%, and the solution was then filtered through a microfilter of 0.1 $\mu$m to prepare respective positive photoresist compositions. Their formulations are shown in the following Table 2.

(Evaluation Test)

Each of the thus obtained positive photoresist composition solutions was coated on a silicon wafer making use of a spin coater and dried at 120° C. for 90 seconds to prepare a positive photoresist film of about 0.5 $\mu$m in thickness which was then exposed to ArF eximer laser (193 nm). After the exposure, the film was subjected to 90 seconds of heat treatment at 110° C., developed with 2.38% tetramethylammonium hydroxide aqueous solution and then rinsed with distilled water to obtain a resist pattern profile.

[Optical Density]

A 1 g portion of each of the resins H to J of the present invention synthesized in the foregoing, m/p-cresol novolak resin or VP-8000 manufactured by Nippon Soda Co., Ltd. was dissolved in 2-heptanone to prepare a solution having a solid content concentration of 15%. This solution was filtered through a 0.20 $\mu$m filter. The thus obtained polymer solution was coated on a quartz glass substrate making use of a spinner and dried at 120° C. for 60 seconds to prepare a film of 1.0 $\mu$m in thickness.

Optical density of the thus obtained paint film was measured at 193 nm using an ultraviolet ray absorption apparatus. The results are shown below.

Resin H: 0.10 $\mu^{-1}$
Resin I: 0.12 $\mu^{-1}$
Resin J: 0.11 $\mu^{-1}$
m/p-Cresol novolak resin: 1.0 $\mu^{-1}$ or more
VP-8000 mfd. by Nippon Soda Co., Ltd.: 1.0 $\mu^{-1}$ or more Based on these results, it was revealed that the resins of the present invention have high transparency at an exposure wave length region of from 170 to 220 nm, which is the target of the present invention, whereas the novolak resin conventionally used in i-line resists and the like and the polyhydroxystyrene resin broadly used as a resin for KrF eximer laser resists have a problem in terms of transparency.

[Relative Sensitivity]

By defining an exposure value which reproduces a large pattern of 1.0 $\mu$m as the sensitivity, and the resist sensitivity of Example 5 to ArF eximer laser exposure as 1, relative sensitivity of the resists of other than Example 5 was calculated based on the following formula.

sensitivity of other than Ex. 5/sensitivity of Ex. 5

[Aging Stability]

After one month of storage at 30° C., sensitivity of each resist prepared in the above was measured by the above-described method to evaluate the resist based on the coefficient of variation from its sensitivity before the storage, and it was also evaluated based on the coefficient of variation of the film loss value, which is a rate of change calculated by observing the profile of un-exposed part under a scanning electron microscope (SEM) to measure thickness of the film after development, measuring changes in the thickness of film before exposure and after development, before and after the aging storage, and dividing the measured value by the film thickness before exposure.

The results are shown in Table 2

TABLE 2

| No. | Resin | Basic low molecular weight compound | Relative sensitivity | Variation of sensitivity | Variation of film thickness loss |
|---|---|---|---|---|---|
| Example 5 | H | triphenylimidazole 0.04 g | 1.0 | 5% or less | 5% or less |
| Example 6 | I | triphenylimidazole 0.04 g | 1.0 | 5% or less | 5% or less |
| Example 7 | J | triphenylimidazole 0.04 g | 1.1 | 5% or less | 5% or less |
| Example 8 | H | 4-dimethylaminopyridine 0.02 g | 1.0 | 5% or less | 5% or less |
| Example 9 | I | 4-dimethylaminopyridine 0.02 g | 1.0 | 5% or less | 5% or less |
| Example 10 | J | 4-dimethylaminopyridine 0.02 g | 1.1 | 5% or less | 5% or less |
| Example 11 | H | 2-dimethylaminopyridine 0.03 g | 1.0 | 5% or less | 5% or less |
| Example 12 | I | 2-dimethylaminopyridine 0.03 g | 1.0 | 5% or less | 5% or less |
| Example 13 | J | 4-dimethylaminopyridine 0.03 g | 1.1 | 5% or less | 5% or less |
| Comp. Ex. 4 | H | — | 0.9 | 50% | 45% |
| Comp. Ex. 5 | I | — | 0.9 | 40% | 50% |
| Comp. Ex. 6 | J | — | 1.0 | 55% | 60% |

All of Comparative Examples 4 to 6 have problems in terms of the variation of sensitivity and film thickness loss with lapse of time. On the other hand, all of Examples 5 to 13 concerning the positive photoresist composition of the present invention are at satisfactory levels. In other words, the inventive composition is suited for lithography which uses far ultraviolet rays including ArF eximer laser exposure.

As has been described in the foregoing, the present invention can provide a positive photoresist composition which is sufficiently suited for a light particularly having a wave length region of from 170 nm to 220 nm, has high sensitivity, is excellent in terms of aging stability, especially in inhibiting aging sensitivity variation and film thickness loss, and can provide excellent resist pattern profiles.

While the invention has been described in detail and with reference to specific embodiments thereof, it will be apparent to one skilled in the art that various changes and modifications can be made therein without departing from the spirit and scope thereof.

What is claimed is:

1. A positive photoresist composition for far ultraviolet ray exposure use, which comprises a resin that contains a repeating structural unit composed of a monomer represented by the following general formula [I] and another monomer having an amine structure in its molecule and is decomposed by the action of an acid thereby increasing its alkali solubility, and a compound that generates an acid by irradiation of an active light ray or radiation:

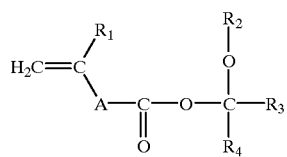

[I]

wherein $R_1$ represents a hydrogen atom or a methyl group, $R_2$ represents an alkyl group, a cyclic alkyl group or a substituted alkyl group, $R_3$ and $R_4$ may be the same or different and each represents a hydrogen atom or an alkyl group, with the proviso that at least one of $R_3$ and $R_4$ is a hydrogen atom, and A represents a single bond or one group or a combination of two or more groups selected from an alkylene group, a substituted alkylene group, an ether group, a thioether group, a carbonyl group, an ester group, an amido group, a sulfonamido group, a urethane group and a urea group.

2. The positive photoresist composition for far ultraviolet ray exposure use according to claim 1, wherein the repeating structural unit content of the resin, corresponding to said monomer having an amine structure in its molecule, is within the range of from 0.001 mol % to 10 mol % based on the total repeating unit.

3. The positive photoresist composition for far ultraviolet ray exposure use according to claim 1 or 2, wherein said monomer having an amine structure in its molecule is a monomer represented by the following general formula [II]:

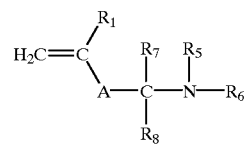

[II]

wherein $R_1$ represents a hydrogen atom or a methyl group, A represents a single bond or one group or a combination of two or more groups selected from an alkylene group, a substituted alkylene group, an ether group, a thioether group, a carbonyl group, an ester group, an amido group, a sulfonamido group, a urethane group and a urea group, $R_5$ and $R_6$ may be the same or different and each represents an alkyl group or a substituted alkyl group, or $R_5$ and $R_6$ may be linked to each other to form a ring which may contain a hetero atom, and $R_7$ and $R_8$ may be the same or different and each represents a hydrogen atom, an alkyl group or a substituted alkyl group.

4. The positive photoresist composition for far ultraviolet ray exposure use according to claim 1, wherein said resin further contains a repeating structural unit having an alicyclic hydrocarbon moiety in its molecule.

5. A positive photoresist composition for far ultraviolet ray exposure use, which comprises a resin that contains a monomer represented by the following general formula (I') as a repeating structural unit and is decomposed by the action of an acid thereby increasing its alkali solubility, a compound that generates an acid by irradiation of an active light ray or radiation and a basic low molecular weight compound:

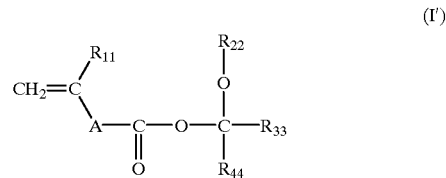

(I')

wherein $R_{11}$ represents a hydrogen atom or a methyl group, $R_{22}$ represents an alkyl group, a cyclic alkyl group or a substituted alkyl group, $R_{33}$ and $R_{44}$ may be the same or different and each represents a hydrogen atom or an alkyl group and A represents a single bond or one group or a combination of two or more groups selected from the group consisting of an alkylene group, a substituted alkylene group, an ether group, a thioether group, a carbonyl group, an ester group, an amido group, a sulfonamido group, a urethane group and a urea group, wherein the content of said basic low molecular weight compound is within the range of from 0.001% by weight to 10% by weight based on the total solid content, and wherein said basic low molecular weight compound is at least one selected from the group consisting of triphenvlimidazole, 4-dimethylaminopvridine and 2-dimethylaminopyridine.

6. The positive photoresist composition for far ultraviolet ray exposure use according to claim 5, wherein said resin further contains a repeating structural unit having an alicyclic hydrocarbon moiety in its molecule.

7. The positive photoresist composition for far ultraviolet ray exposure use according to claim 5, wherein the content of said basic low molecular weight compound is within the range of from 0.001% by weight to 8% by weight based on the total solid content.

* * * * *